United States Patent
Jiang

(10) Patent No.: US 11,687,197 B2
(45) Date of Patent: Jun. 27, 2023

(54) CAPACITANCE DETECTION CIRCUIT, DETECTION CHIP AND ELECTRONIC DEVICE

(71) Applicant: SHENZHEN GOODIX TECHNOLOGY CO., LTD., Shenzhen (CN)

(72) Inventor: Hong Jiang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 227 days.

(21) Appl. No.: 17/010,809

(22) Filed: Sep. 2, 2020

(65) Prior Publication Data

US 2021/0034178 A1 Feb. 4, 2021

Related U.S. Application Data

(63) Continuation of application No. PCT/CN2019/098900, filed on Aug. 1, 2019.

(51) Int. Cl.
*G06F 3/044* (2006.01)
*G01R 27/26* (2006.01)
*G06F 3/041* (2006.01)
*H03K 17/955* (2006.01)

(52) U.S. Cl.
CPC ......... *G06F 3/044* (2013.01); *G01R 27/2605* (2013.01); *G06F 3/0416* (2013.01); *H03K 17/955* (2013.01)

(58) Field of Classification Search
CPC ... G06F 3/044; G06F 3/0146; G01R 27/2605; H03K 17/955
See application file for complete search history.

(56) References Cited

U.S. PATENT DOCUMENTS

2012/0256868 A1 10/2012 Choi et al.
2018/0209858 A1* 7/2018 Feng ................... G06F 3/044

FOREIGN PATENT DOCUMENTS

| CN | 103294321 A | 9/2013 | |
|---|---|---|---|
| CN | 107466368 A | 12/2017 | |
| CN | 108124474 | 6/2018 | |
| CN | 108475155 | 8/2018 | |
| WO | WO-2017166058 A1 * | 10/2017 | ............ G06F 3/044 |

* cited by examiner

*Primary Examiner* — Wing H Chow
(74) *Attorney, Agent, or Firm* — Emerson Thomson Bennett; Roger D. Emerson, Esq

(57) ABSTRACT

A capacitance detection circuit, a detection chip, and an electronic device are provided. The circuit includes: a first drive module, a conversion module, a processing module, and a control module. The first drive module is configured to charge a first capacitor to be detected. The conversion module is configured to perform charge conversion processing on the first capacitor to be detected to generate an output voltage. The control module is configured to control a first suppression module of the conversion module to suppress an interference signal with a frequency less than a first frequency or greater than a second frequency when the conversion module generates the output voltage, and the second frequency is greater than the first frequency. The processing module is configured to determine a capacitance change before and after the first capacitor to be detected is affected by an applied electric field based on the output voltage.

18 Claims, 10 Drawing Sheets

US 11,687,197 B2

CAPACITANCE DETECTION CIRCUIT, DETECTION CHIP AND ELECTRONIC DEVICE

CROSS-REFERENCE TO RELATED APPLICATION

This application is a continuation of International Application No. PCT/CN2019/098900, filed on Aug. 1, 2019, the application of which is hereby incorporated by reference in its entirety.

TECHNICAL FIELD

Embodiments of the present disclosure relate to the technical field of capacitance detection, and specifically to a capacitance detection circuit, a detection chip, and an electronic device.

BACKGROUND

Capacitance detection technology is widely used in electronic devices and can realize human-computer interaction. For example, a capacitive touch screen on an electronic device can realize a touch control function through capacitance detection; as another example, a capacitance detection module on a headset can automatically detect whether a user is wearing the headset. Of course, here is only an exemplary description. For self-capacitance, during capacitance detection, when no human body approaching or touching, there is self-capacitance between a detection electrode and the circuit ground. When a human body approaches or touches the detection electrode, the capacitance between the detection electrode and the circuit ground may increase, a relevant operation of the user may be determined by detecting a change in the capacitance.

However, in some application scenarios, due to the presence of some interference signals, especially low-frequency interference signals during the detection, the sensitivity and accuracy of capacitance detection are low, and a relevant operation of the user cannot be accurately determined.

SUMMARY

In view of this, embodiments of the present disclosure provide a capacitance detection circuit, a detection chip, and an electronic device to overcome or alleviate the technical defect in the existing technology.

In a first aspect, the embodiments of the present disclosure provide a capacitance detection circuit, including: a first drive module, a conversion module, a processing module, and a control module; the first drive module is configured to charge first capacitor to be measured; the conversion module is configured to perform charge conversion processing on the first capacitor to be measured to generate an output voltage, the conversion module including a first suppression module, the control module is configured to control the first suppression module to suppress an interference signal with a frequency that is less than a first frequency or greater than a second frequency when the conversion module generates the output voltage, and the second frequency is greater than the first frequency; and the processing module is configured to determine a capacitance change before and after the first capacitor to be measured is affected by an applied electric field based on the output voltage.

In a second aspect, an embodiment of the present disclosure provides a detection chip, including: the capacitance detection circuit according to any one of the embodiments in the first aspect.

In a third aspect, an embodiment of the present disclosure provides an electronic device, including: the detection chip according to the second aspect.

The capacitance detection circuit, the detection chip, and the electronic device of the embodiments of the present disclosure, suppress the interference signal with the frequency that is less than the first frequency or greater than the second frequency using the first suppression module, when the output voltage is generated by the conversion module, thereby reducing the influence of the interference signal, and improving the sensitivity and accuracy of capacitance detection.

BRIEF DESCRIPTION OF THE DRAWINGS

Hereinafter, some specific embodiments of the embodiments of the present disclosure will be described in detail in an exemplary but not restrictive method with reference to the accompanying drawings. In the accompanying drawings, the same reference numerals designate the same or similar components or parts. Those skilled in the art should understand that these accompanying drawings are not necessarily drawn to scale. In the accompanying drawings.

DETAILED DESCRIPTION OF EMBODIMENTS

The implementation of any technical solution of the embodiments of the present disclosure does not necessarily need to achieve all the above advantages at the same time.

In order to enable those skilled in the art better understand the technical solutions of the embodiments of the present disclosure, in conjunction with the accompanying drawings in the embodiments of the present disclosure, the technical solutions in the embodiments of the present disclosure will be clearly and completely described below, obviously, the described embodiments are only part of the embodiments of the present disclosure, rather than all the embodiments. Based on the embodiments in the embodiments of the present disclosure, all other embodiments obtained by those of ordinary skill in the art should fall within the protection scope of the embodiments of the present disclosure.

The specific implementation of the embodiments of the present disclosure will be further described below in conjunction with the accompanying drawings of the embodiments of the present disclosure.

The capacitance detection circuit provided in the embodiments of the present disclosure may be applied to self-capacitance detection and mutual capacitance detection. To this end, in the following embodiments, the capacitance detection circuit applied to self-capacitance detection is first described, and then, the connection of the capacitance detection circuit in mutual capacitance detection will be described.

Embodiment 1, the capacitance detection circuit when applied to self-capacitance detection (FIG. 1 to FIG. 14)

Figure 1:
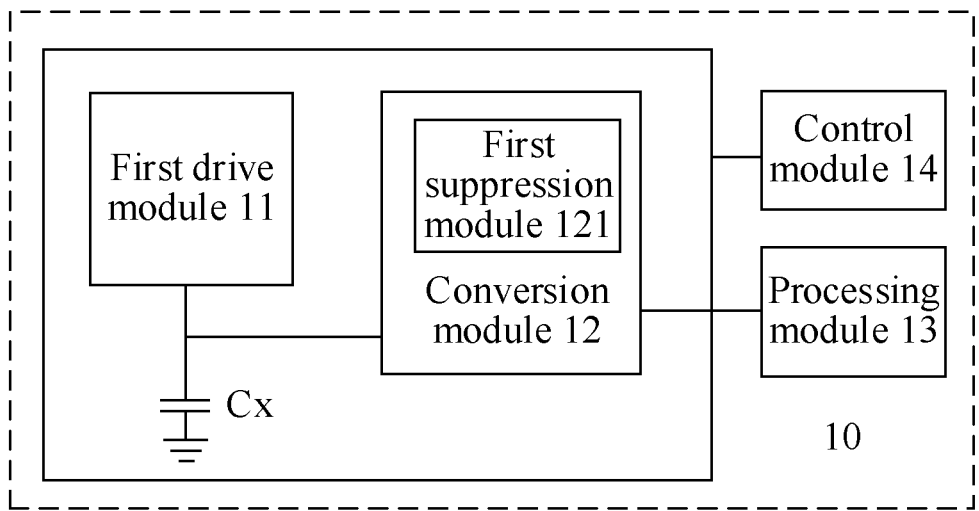
FIG. 1 is a structural diagram of a capacitance detection circuit provided by an embodiment of the present disclosure.

As shown in FIG. 1, FIG. 1 is a structural diagram of a capacitance detection circuit provided by an embodiment of the present disclosure. As shown in FIG. 1, the capacitance detection circuit 10 includes: a first drive module 11, a conversion module 12, a processing module 13, and a control module 14; the first drive module 11 is configured to charge a first capacitor to be measured Cx; the conversion module 12 is configured to perform charge conversion processing on the first capacitor to be measured to generate an output voltage, the conversion module 12 including a first suppression module 121, the control module 14 is configured to control the first suppression module 121 to suppress an interference signal with a frequency that is less than a first frequency or greater than a second frequency when the conversion module 12 generates the output voltage, and the second frequency is greater than the first frequency; and the processing module 13 is configured to determine a capacitance change before and after the first capacitor to be measured is affected by an applied electric field based on the output voltage.

When the capacitance detection circuit 10 operates, the first drive module 11 charges the first capacitor to be measured, the conversion module 12 performs charge conversion processing on the first capacitor to be measured to generate the output voltage, and the conversion module 12 performs conversion processing on charge transferred by the first capacitor to be measured to generate the output voltage. In this regard, the first suppression module 121 suppresses a signal with a frequency that is less than the first frequency or greater than the second frequency. When an object approaches the first capacitor to be measured, the capacitance of the first capacitor to be measured changes. In this regard, the charge transferred from the first capacitor to be measured to the conversion module changes, and the output voltage output by the conversion module changes. In this way, it may be detected that an object is approaching the first capacitor to be measured.

Figure 2:
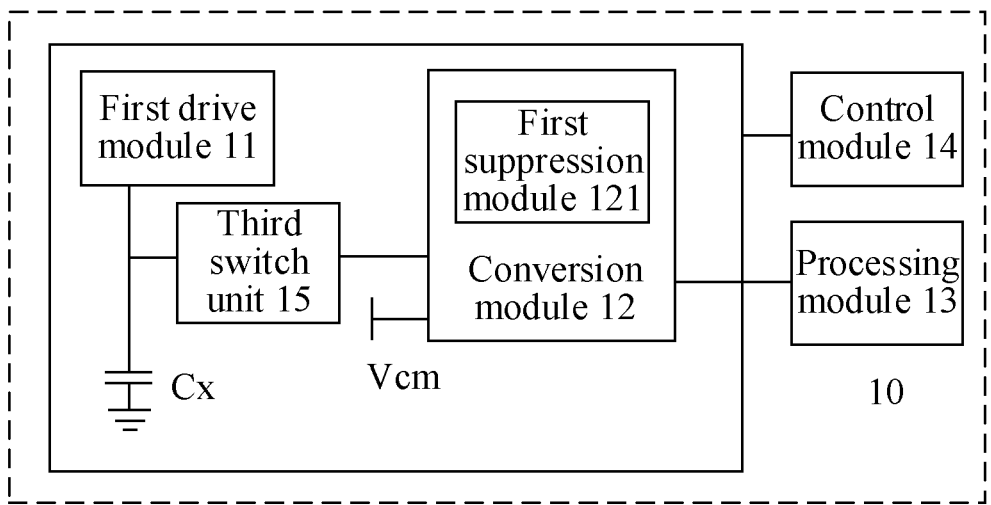
FIG. 2 is a structural diagram of a capacitance detection circuit provided by an embodiment of the present disclosure.

FIG. 2 is a structural diagram of a capacitance detection circuit provided by an embodiment of the present disclosure. In FIG. 2, the capacitance detection circuit 10 further includes a third switch unit 15, and the third switch unit 15 is connected between the first drive module 11 and a first input terminal of the conversion module 12. When the third switch unit 15 is turned off, the first drive module 11 charges the first capacitor to be measured, and when the third switch unit 15 is turned on, the conversion module 12 performs charge conversion processing on the first capacitor to be measured to generate the output voltage. In a self-capacitance detection circuit, when the third switch unit 15 is turned on, it is a charge transfer phase. The third switch unit 15 may be a single-pole single-throw switch, and when the third switch unit 15 is connected to the first capacitor to be measured and the conversion module 12, it is the charge transfer phase. In FIG. 2, taking the third switch unit 15 controlling the connection or disconnection of the first capacitor to be measured and the conversion module 12 as an example, typically, the first drive module 11 is also equipped with a switch, and in a charging phase, the first drive module 11 and the first capacitor to be measured are connected, in this regard, the third switch unit 15 is turned off; in the charge transfer phase, the switch of the first drive module 11 is turned off, so that the first drive module 11 and the first capacitor to be measured are disconnected, and in this regard, the third switch unit 15 is turned on. Of course, here is only an exemplary description, and does not mean that the present disclosure is limited herein.

Alternatively, in an embodiment of the present disclosure, the conversion module 12 has a first input terminal and a second input terminal, the first input terminal of the conversion module 12 is electrically connected to the first drive module 11, and the second input terminal of the conversion module 12 is connected to a common mode voltage and/or is connected to other circuits that capable to equivalently generate the common mode voltage. Specifically, the conversion module 12 may include a differential amplifier. The differential amplifier may be a single-ended differential amplifier 122 or a double-ended differential amplifier 123. Here, two specific application scenarios are listed to illustrate the situations where the conversion module 12 respectively includes the single-ended differential amplifier 122 and the double-ended differential amplifier 123.

Figure 3:
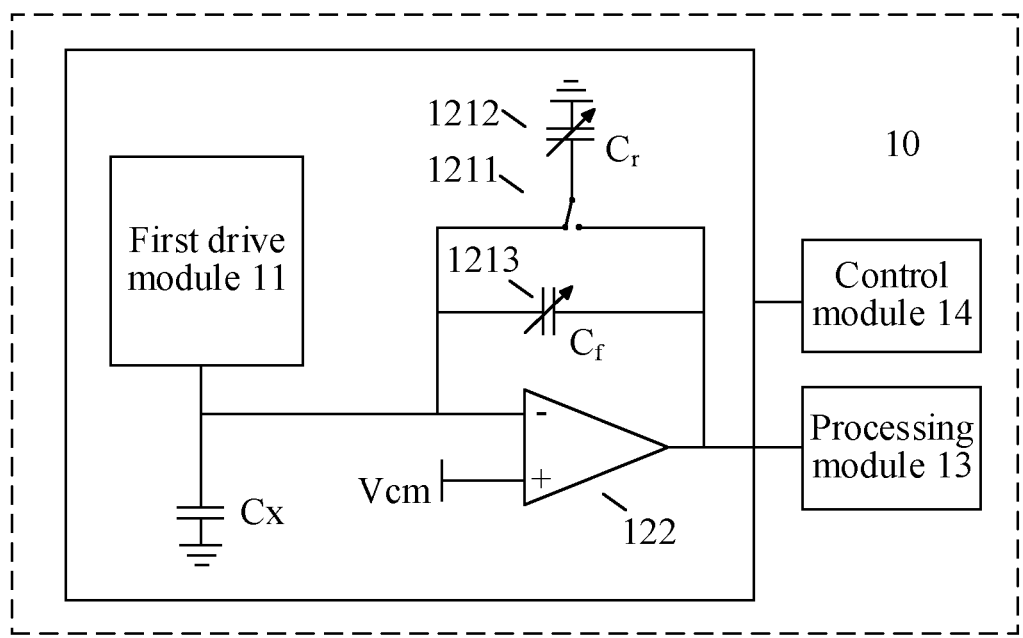
FIG. 3 is a structural diagram of a capacitance detection circuit provided by an embodiment of the present disclosure.

FIG. 3 is a structural diagram of a capacitance detection circuit provided by an embodiment of the present disclosure. Alternatively, in a first application scenario, taking the conversion module including the single-ended differential amplifier 122 as an example, the first input terminal of the conversion module 12 is an inverting input terminal of the single-ended differential amplifier 122, the second input terminal of the conversion module 12 is a non-inverting input terminal of the single-ended differential amplifier 122, the first drive module 11 is electrically connected to the inverting input terminal of the single-ended differential amplifier 122, the non-inverting input terminal of the single-ended differential amplifier 122 is connected to the common mode voltage, and an output terminal of the single-ended differential amplifier 122 is electrically connected to the processing module 13; and two terminals of the first suppression module 121 are respectively connected to the inverting input terminal and the output terminal of the single-ended differential amplifier 122.

As shown in FIG. 3, the conversion module 12 includes the single-ended differential amplifier 122 is used as an example for description. The first suppression module 121 includes a first switch unit 1211, a first capacitor 1212, and a second capacitor 1213; a first terminal and a second terminal of the first switch unit 1211 are respectively connected to the inverting input terminal and the output terminal of the single-ended differential amplifier 122, the first capacitor 1212 may be respectively connected to the first terminal of the first switch unit 1211 and the second terminal of the first switch unit 1211 through a third terminal of the first switch unit 1211, a second terminal of the first capacitor 1212 is grounded, and two terminals of the second capacitor 1213 are respectively connected to the inverting input terminal and the output terminal of the single-ended differential amplifier 122.

During the charge transfer, the control module 14 is configured to control the first switch unit 1211 to switch back and forth between the first terminal and the second terminal, so that the third terminal of the first switch unit 1211 is connected to the first terminal or the third terminal is connected to the second terminal, a switching frequency of the first switch unit 1211 is greater than twice a driving frequency (i.e., the driving frequency of the first drive module 11), to suppress an electrical signal with a frequency less than the first frequency. And after the charge transfer is complete, the control module 14 controls the first switch unit 1211 to switch back and forth between the first terminal and the second terminal, so that the third terminal of the first switch unit 1211 is connected to the first terminal or the third terminal is connected to the second terminal, to perform reset processing on the second capacitor 1213. Here, it should be noted that, in the self-capacitance circuit, the driving frequency (i.e., the driving frequency of the first drive module 11) refers to the switching frequency at which the third switch unit 15 is turned on and turned off. The first suppression module 121 suppresses the electrical signal with the frequency less than the first frequency mainly for the interference signal generated by the power supply. Typically, the interference signal generated by the power supply is within 50 Hz. Therefore, the first frequency may be 50 Hz. Of course, here is only an exemplary description.

The first switch unit 1211 may include a single-pole double-throw switch, to switch back and forth between the first terminal and the second terminal, so that the third terminal of the first switch unit 1211 is connected to the first terminal or the third terminal is connected to the second terminal. Alternatively, the first switch unit 1211 may include two single-pole single-throw switches, one single-pole single-throw switch is turned on, and the other single-pole single-throw switch is turned off, that is, the two single-pole single-throw switches are alternately turned on and turned off to function as one single-pole double-throw switch. Of course, here is only an exemplary description, and does not mean that the present disclosure is limited herein.

Figure 4:
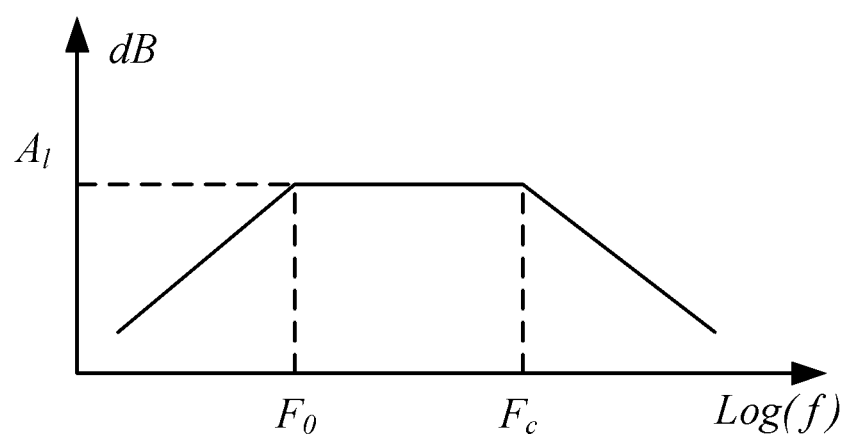
FIG. 4 is a schematic diagram of an amplitude-frequency characteristic provided by an embodiment of the present disclosure.

The first switch unit 1211 switches back and forth between the first terminal and the second terminal, and the first capacitor 1212 may form a circuit having resistance characteristics, and its equivalent resistance $R=1/(F \times Cr)$, where F is the switching frequency of the first switch unit 1211, Cr is the capacitance value of the first capacitor 1212. The combination of the second capacitor 1213, the first switch unit 1211 and the first capacitor 1212 adds a zero point $F_0$ to the capacitance detection circuit 10, and this zero point may be directly used as the first frequency. As shown in FIG. 4, FIG. 4 is a schematic diagram of an amplitude-frequency characteristic provided by an embodiment of the present disclosure. The gain of a signal before the zero point decreases as the frequency decreases, and the amplitude-frequency response after the zero point is flat. The gain of a signal before the zero point decreases as the frequency decreases, and since the differential amplifier (single-ended differential amplifier 122 or double-ended differential amplifier 123) has a dominant pole Fc, and the dominant pole may be directly used as the second frequency, the higher the frequency after the dominant pole, the lower the gain, which makes the operating frequency band of the capacitance detection circuit 10 is between $F_0$ and Fc, that is, the interference signal with the frequency less than the first frequency and greater than the second frequency is suppressed.

Alternatively, in order to improve the sensitivity of the capacitance detection circuit 10, the gain of the capacitance detection circuit 10 may be increased, for example, the capacitance value $C_f$ of the second capacitor 1213 may be reduced. The less the value of $C_f$, the greater the capacitive reactance and the greater the gain; or, the capacitance value Cr of the first capacitor 1212 may be reduced, according to $R=1/(F \times Cr)$, the less the value of Cr, the greater the equivalent impedance, the greater the gain; or, the switching frequency of the first switch unit 1211 may be reduced, the lower the switching frequency of the first switch unit 1211, the greater the equivalent impedance, and the greater the gain. Of course, it is also necessary to satisfy the relationship that the switching frequency of the first switch unit 1211 is greater than twice the power supply frequency.

Figure 5:
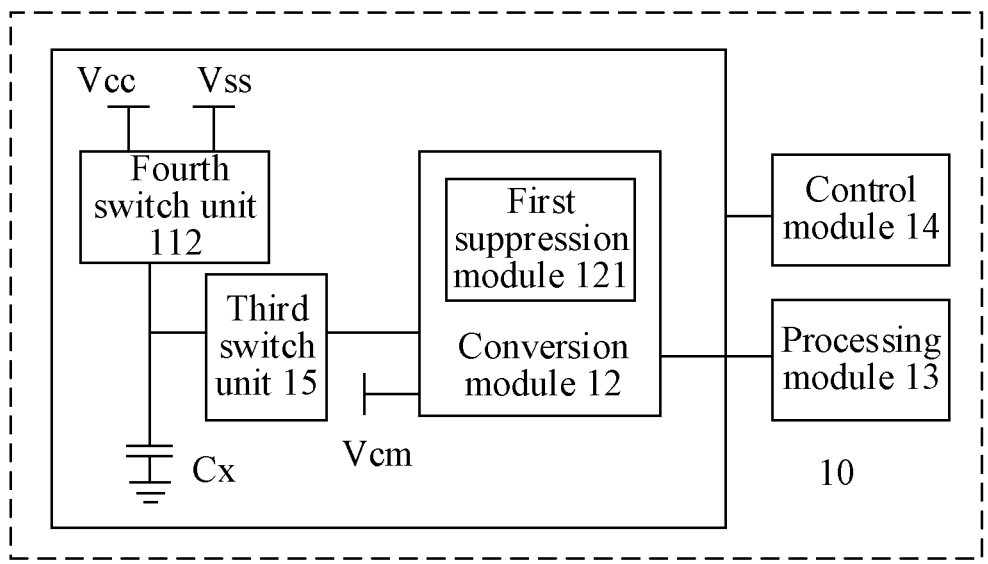
FIG. 5 is a structural diagram of a capacitance detection circuit provided by an embodiment of the present disclosure.

FIG. 5 is a structural diagram of a capacitance detection circuit provided by an embodiment of the present disclosure. Combined with the capacitance detection circuit 10 shown in FIG. 2, in FIG. 5, the first drive module 11 includes a fourth switch unit 112, and the control module 14 is further configured to control the fourth switch unit 112 to be in a first closed state so that the first drive module 11 charges the first capacitor to be measured; specifically, since when the fourth switch unit 112 is in the first closed state, a first terminal of the first capacitor to be measured is connected to a first voltage (Vcc) through the fourth switch unit 112, a second terminal of the first capacitor to be measured is connected to a second voltage (such as gnd), and the first voltage is greater than the second voltage, thereby realizing charging the first capacitor to be measured.

Figure 5A:
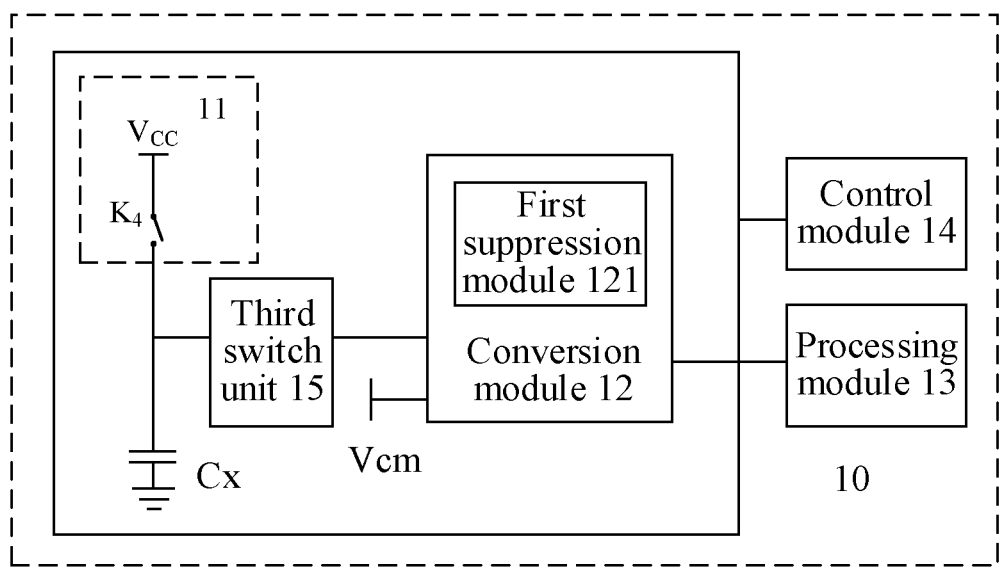
FIG. 5a is a structural diagram of a capacitance detection circuit provided by an embodiment of the present disclosure.

FIG. 5a is a structural diagram of a capacitance detection circuit provided by an embodiment of the present disclosure. In FIG. 5a, the fourth switch unit 112 includes a fourth switch $K_4$, the fourth switch $K_4$ is a single-pole single-throw switch, one terminal of the fourth switch $K_4$ is connected to the first voltage (Vcc), and the other terminal of the fourth switch $K_4$ is connected to the first capacitor to be measured. When the fourth switch $K_4$ is turned on, the fourth switch unit 112 is in the first closed state. In this regard, the two terminals of the first capacitor to be measured are connected to the first voltage (Vcc) and the second voltage (such as gnd) respectively, realizing charging the first capacitor to be measured.

Alternatively, the control module 14 is further configured to control the fourth switch unit 112 to be in a second closed state to discharge the first capacitor to be measured; specifically, since when the fourth switch unit 112 is in the second closed state, the first terminal of the first capacitor to be measured is connected to a third voltage (Vss) through the fourth switch unit 112, the second terminal of the first capacitor to be measured is connected to the second voltage, and the second voltage is higher than the third voltage, thereby discharging the first capacitor to be measured. When the fourth switch unit 112 has two closed states, it can offset high-correlation noise, mainly low-frequency noise in the circuit, thereby significantly improving the signal-to-noise ratio.

The fourth switch unit 112 may include a single-pole double-throw switch, realizing two closed states by connecting two connecting terminals, or the fourth switch unit 112 may include two single-pole single-throw switches, the first single-pole single-throw switch is turned on, and the second single-pole single-throw switch is turned off to be the first closed state, the first single-pole single-throw switch is turned off, and the second single-pole single throw switch is turned on to be the second closed state. Of course, here is only an exemplary description, and does not mean that the present disclosure is limited herein.

Figure 5B:
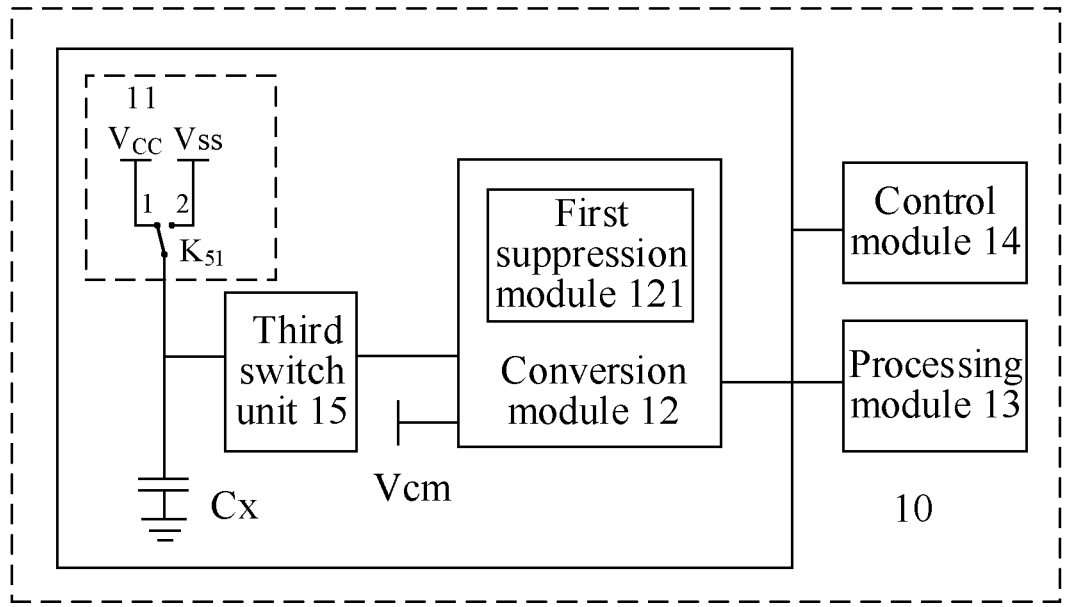
FIG. 5b is a structural diagram of a capacitance detection circuit provided by an embodiment of the present disclosure.

FIG. 5b is a structural diagram of a capacitance detection circuit provided by an embodiment of the present disclosure. In FIG. 5b, the fourth switch unit 112 includes a fifth switch $K_{51}$, the fifth switch $K_{51}$ is a single-pole double-throw switch, a first terminal of the fifth switch $K_{51}$ is connected to the first voltage, a second terminal of the fifth switch $K_{51}$ is connected to the third voltage, and a third terminal of the fifth switch $K_{51}$ is connected to the first capacitor to be measured. When the first terminal and the third terminal of the fifth switch $K_{51}$ are connected, the fourth switch unit 112 is in the first closed state, and the two terminals of the first capacitor to be measured are respectively connected to the first voltage (Vcc) and the second voltage (such as gnd), realizing charging of the first capacitor to be measured; and when the second terminal and the third terminal of the fifth switch $K_{51}$ are connected, the fourth switch unit 112 is in the second closed state, and the two terminals of the first capacitor to be measured are respectively connected to the second voltage (such as gnd) and the third voltage (Vss), realizing discharging the first capacitor to be measured.

Figure 6:
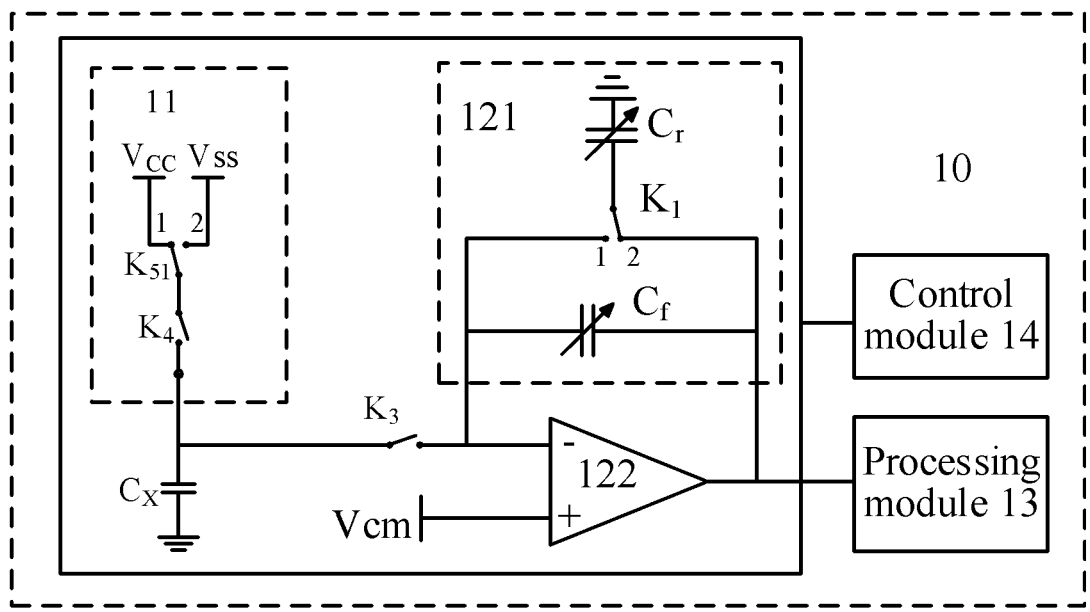
FIG. 6 is a structural diagram of a capacitance detection circuit provided by an embodiment of the present disclosure.

Here, the first application scenario will be described in detail in conjunction with the capacitance detection circuit shown in FIGS. 3 and 5, and the circuit structure will be described in detail with reference to the capacitance detection circuit shown in FIG. 6. FIG. 6 is a structural diagram of a capacitance detection circuit provided by an embodiment of the present disclosure. In FIG. 6, the first switch unit 1211 may include a first switch $K_1$; the third switch unit 15 is $K_3$; the fourth switch unit 112 may include a fourth switch $K_4$, and may also include a fifth switch $K_{51}$.

As shown in FIG. 6, the capacitance detection circuit 10 is a self-capacitance detection circuit, and the differential amplifier included in the conversion module 12 is the single-ended differential amplifier 122. The first drive module 11 includes the fourth switch $K_4$ and the fifth switch $K_{51}$, a first terminal of the fourth switch $K_4$ is electrically connected to the first terminal of the first capacitor to be measured Cx, the second terminal of the first capacitor to be measured Cx is grounded (the ground voltage is the second voltage), a second terminal of the fourth switch $K_4$ is electrically connected to the third terminal of the fifth switch, the first terminal of the fifth switch $K_{51}$ is connected to the first voltage Vcc, and the second terminal of the fifth switch $K_{51}$ is connected to the third voltage Vss; where the fourth switch $K_4$ is turned on and the first terminal and the third terminal of the fifth switch $K_{51}$ are connected, and the first capacitor to be measured is connected to the first voltage Vcc, in this regard, the fourth switch unit 112 is in the first closed state; the fourth switch $K_4$ is turned on and the second terminal and the third terminal of the fifth switch $K_{51}$ are connected, and the first capacitor to be measured is connected to the third voltage Vss, in this regard, the fourth switch unit 112 is in the second closed state. Two terminals of the third switch unit $15K_3$ are electrically connected to the first terminal of the first capacitor to be measured and the inverting input terminal of the single-ended differential amplifier 122, respectively. The non-inverting input terminal of the single-ended differential amplifier 122 is connected to the common mode voltage Vcm, and the output terminal of the single-ended differential amplifier 122 (that is, the first output terminal of the single-ended differential amplifier 122) is connected to the processing module 13. In the first suppression module 121, in the first suppression module 121, a first terminal and a second terminal of the first switch $K_1$ are respectively connected to the inverting input terminal and the output terminal of the single-ended differential amplifier 122, the first capacitor 1212 may be respectively connected to the first terminal of the first switch $K_1$ and the second terminal of the first switch $K_1$ through a third terminal of the first switch $K_1$, the second terminal of the first capacitor $1212C_r$ is grounded, and the two terminals of the second capacitor $1213C_f$ are respectively connected to the inverting input terminal and the output terminal of the single-ended differential amplifier 122.

Alternatively, in a second application scenario, taking the conversion module 12 including the double-ended differential amplifier 123 as an example, the double-ended differential amplifier 123 has a non-inverting input terminal, an inverting input terminal, a first output terminal, and a second output terminal, the first input terminal of the conversion module 12 is the inverting input terminal of the double-ended differential amplifier 123, the second input terminal of the conversion module 12 is the non-inverting input terminal of the double-ended differential amplifier 123, the first drive module 11 is electrically connected to the inverting input terminal of the double-ended differential amplifier 123, the non-inverting input terminal of the double-ended differential amplifier 123 is connected to the common mode voltage, and the first output terminal and the second output terminal of the double-ended differential amplifier 123 are both electrically connected to the processing module 13; and two terminals of the first suppression module 121 are respectively connected to the inverting input terminal and the first output terminal of the double-ended differential amplifier 123.

In an example, the input terminal and the output terminal of the double-ended differential amplifier 123 may be connected to only one first suppression module 121. In this regard, the double-ended differential amplifier 123 is equivalent to the single-ended differential amplifier 122, and the input terminal and the output terminal of the double-ended differential amplifier 123 are equipped with the first suppression module 122 and a second suppression module 124 at the same time. In this regard, the dynamic range of the detection circuit is relatively large, and a relatively large gain may be achieved, thereby improving the sensitivity of detection.

Figure 7:
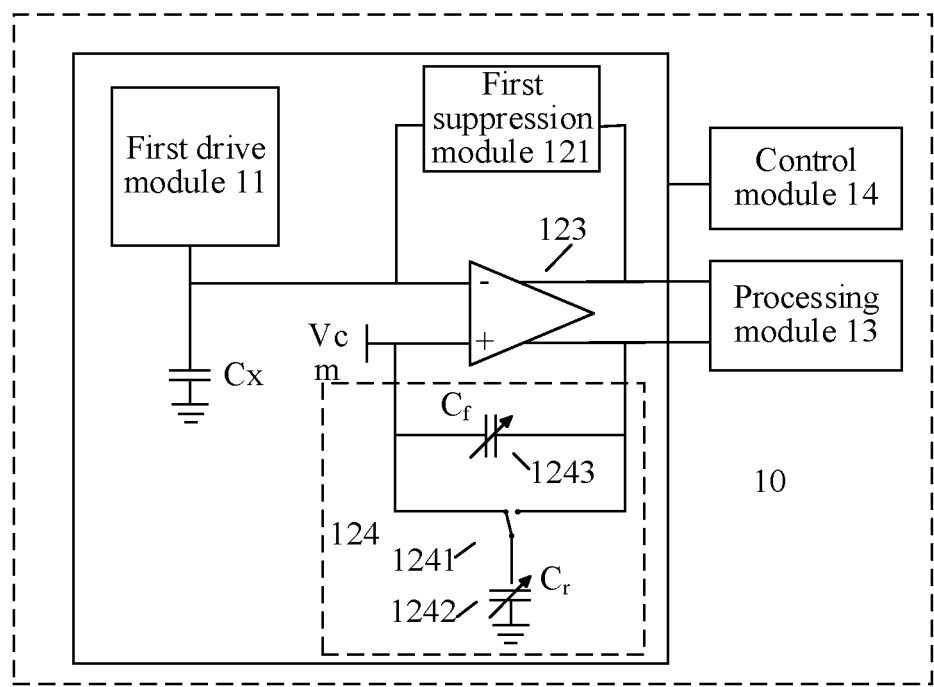
FIG. 7 is a structural diagram of a capacitance detection circuit provided by an embodiment of the present disclosure.

FIG. 7 is a structural diagram of a capacitance detection circuit provided by an embodiment of the present disclosure. As shown in FIG. 7, the conversion module 12 respectively including the double-ended differential amplifier 123 is used as an example for description. The conversion module 12 further includes a second suppression module 124, two terminals of the second suppression module 124 are respectively connected to the non-inverting input terminal and the second output terminal of the double-ended differential amplifier 123, the control module 14 is configured to control the second suppression module 124 to suppress the interference signal with the frequency that is less than the first frequency or greater than the second frequency when the conversion module 12 generates the output voltage, and the second frequency is greater than the first frequency.

Alternatively, as shown in FIG. 7, in an embodiment of the present disclosure, the second suppression module 124 includes a second switch unit 1241, a third capacitor 1242, and a fourth capacitor 1243; a first terminal and a second terminal of the second switch unit 1241 are respectively connected to the non-inverting input terminal and the second output terminal of the double-ended differential amplifier 123, two terminals of the fourth capacitor 1243 are respectively connected to the first terminal of the second switch unit 1241 and the second terminal of the second switch unit 1241, a first terminal of the third capacitor 1242 is electrically connected to a third terminal of the second switch unit 1241, and a second terminal of the third capacitor 1242 is grounded; and the control module 14 is configured to control the second switch unit 1241 to switch back and forth between the first terminal and the second terminal, so that the third terminal of the second switch is connected to the first terminal or the third terminal is connected to the second terminal, a switching frequency of the second switch unit 1241 is greater than twice a driving frequency, to suppress an electrical signal with a frequency less than the first frequency. The principle of the second suppression module 124 is the same as that of the first suppression module 121, and detailed description thereof will be omitted. However, it should be noted that in other application scenarios, the specific structures of the second suppression module 124 and the first suppression module 121 may be different. Alternatively, in an embodiment of the present disclosure, in a self-capacitance detection circuit, the driving frequency is a switching frequency at which a switch in the second drive module is turned on or turned off, or, in a mutual capacitance detection circuit, the driving frequency is a power supply frequency of the second drive module.

The second switch unit 1241 may include a single-pole double-throw switch, to switch back and forth between the first terminal and the second terminal, so that the third terminal of the second switch unit 1241 is connected to the first terminal or the third terminal is connected to the second terminal. Alternatively, the second switch unit 1241 may include two single-pole single-throw switches, one single-pole single-throw switch is turned on, the other single-pole single-throw switch is turned off, and two single-pole single-throw switches are alternately turned on and turned off to function as one single-pole double-throw switch. Of course, here is only an exemplary description, and does not mean that the present disclosure is limited herein.

Figure 8:
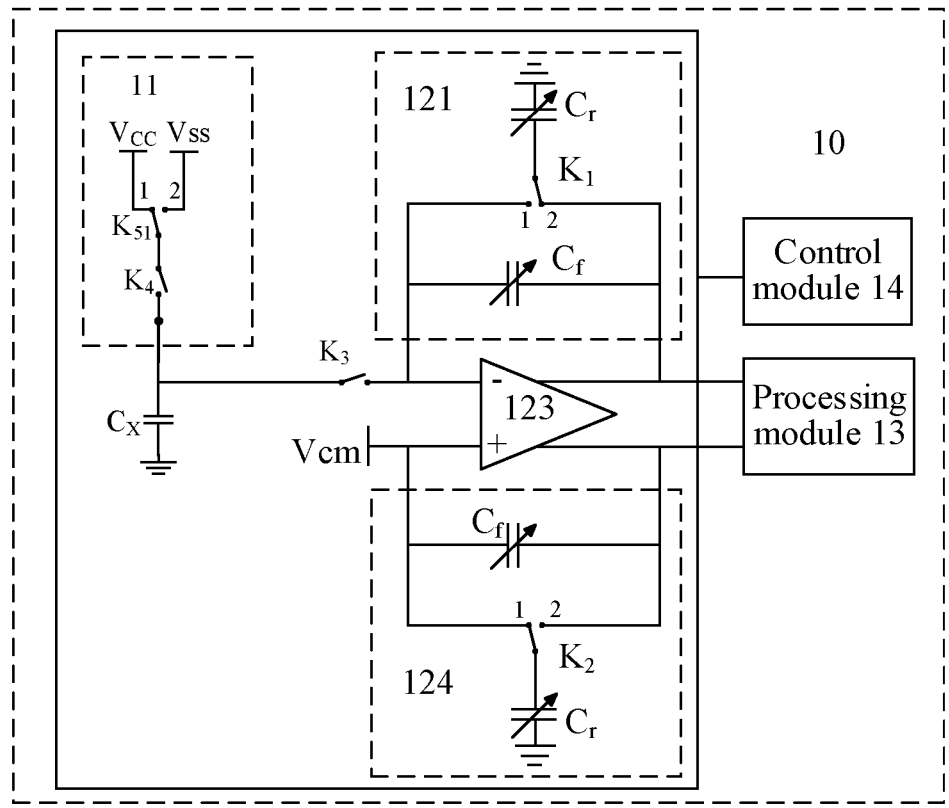
FIG. 8 is a structural diagram of a capacitance detection circuit provided by an embodiment of the present disclosure.

FIG. 8 is a structural diagram of a capacitance detection circuit provided by an embodiment of the present disclosure. Here, the second application scenario will be described in detail in conjunction with the capacitance detection circuit shown in FIG. 7, and the circuit structure will be described in detail with reference to the capacitance detection circuit shown in FIG. 8. In FIG. 8, the first switch unit 1211 may include the first switch $K_1$; the second switch unit 1241 may include a second switch $K_2$; the third switch unit 15 is $K_3$; and the fourth switch unit 112 may include a fourth switch $K_4$, and may also include a fifth switch $K_{51}$.

In FIG. 8, the capacitance detection circuit 10 is a self-capacitance detection circuit, and the differential amplifier included in the conversion module 12 is the double-ended differential amplifier 123. The capacitance detection circuit 10, the first drive module 11, and the first suppression module 121 provided in the present embodiment are the same as those in Embodiment 4, and detailed description thereof will be omitted. The conversion module 12 in the present embodiment further includes the second suppression module 124. In the second suppression module 124, a first terminal and a second terminal of the second switch $K_2$ are respectively connected to the non-inverting input terminal and the second output terminal of the double-ended differential amplifier 123, the two terminals of the fourth capacitor 1243$C_f$ are respectively connected to the first terminal of the second switch $K_2$ and the second terminal of the second switch $K_2$, the first terminal of the third capacitor 1242$C_r$ is electrically connected to the third terminal of the second switch unit 1241, and the second terminal of the third capacitor 1242$C_r$ is grounded. In the present embodiment, the capacitance values of the first capacitor 1212 and the third capacitor 1242 are the same as $C_r$, and the capacitance values of the second capacitor 1213 and the fourth capacitor 1243 are the same as $C_f$.

It should be noted that the capacitance detection circuit 10 shown in FIG. 6 and FIG. 8 is suitable for the case where the self-capacitance of the first capacitor to be measured Cx is small, because the self-capacitance is small and the influence on detection is small.

Figure 9:
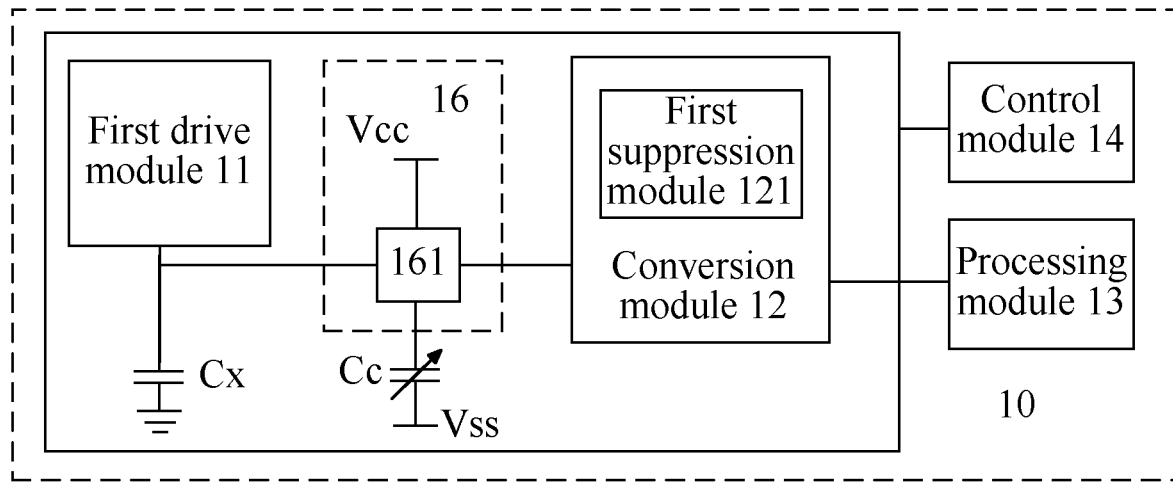
FIG. 9 is a structural diagram of a capacitance detection circuit provided by an embodiment of the present disclosure.

FIG. 9 is a structural diagram of a capacitance detection circuit provided by an embodiment of the present disclosure, alternatively, in an embodiment of the present disclosure, as shown in FIG. 9, the capacitance detection circuit 10 further includes a first offset module 16; and the control module 14 is further configured to control the first offset module 16 to charge a first offset capacitor, and to control the first offset capacitor to charge or discharge the first capacitor to be measured to perform charge offset.

Alternatively, in an embodiment of the present disclosure, as shown in FIG. 9, the first offset module 16 includes a fifth switch unit 161, and the control module 14 is further configured to control the fifth switch unit 161 to be in a first closed state to form a charging branch so that the offset module charges the first offset capacitor; and the control module 14 is further configured to control the fifth switch unit 161 to be in a second closed state to form an offset branch so that the first offset capacitor Cc charges or discharges the first capacitor to be measured to perform charge offset.

The fifth switch unit 161 may include two single-pole double-throw switches, and three closed states are realized by the switching of the two single-pole double-throw switches. Of course, here is only an exemplary description, and does not mean that the present disclosure is limited herein.

Alternatively, in an embodiment of the present disclosure, when the fifth switch unit 161 is in the first closed state, two terminals of the first offset capacitor are respectively connected to a fourth voltage and a fifth voltage, and the fifth voltage is greater than the fourth voltage. In this regard, the first offset capacitor is charged.

Alternatively, in an embodiment of the present disclosure, when the fifth switch unit 161 is in the second closed state, a first terminal of the first offset capacitor is electrically connected to the first terminal of the first capacitor to be measured through the fifth switch unit 161, a second terminal of the first offset capacitor is connected to a sixth voltage or a seventh voltage through the fifth switch unit 161, the sixth voltage is less than the second voltage connected to a second terminal of the capacitor to be detected, in this regard, the first capacitor to be measured is discharged to perform charge offset, and the seventh voltage is greater than the second voltage connected to the second terminal of the capacitor to be detected, in this regard, the first capacitor to be measured is charged to perform charge offset.

It should be noted that when the first offset capacitor discharges the capacitor to be detected to perform charge offset, the charge on the first capacitor to be measured is transferred to the first offset capacitor, and when the first offset capacitor charges the capacitor to be detected to perform charge offset, the charge on the first offset capacitor is transferred to the first capacitor to be measured. The charge transfer in the offset process is to eliminate the influence caused by the existence of a basic capacitance of the first capacitor to be measured, which is different from the charge transfer in the charge transfer phase.

The capacitance detection circuit 10 based on the self-capacitance detection shown in FIG. 3, combined with the structure of the first drive module 11 shown in the capacitance detection circuit 10 shown in FIG. 5, and the structure of the first offset module 16 shown in the capacitance detection circuit 10 shown in FIG. 9, the operation sequence of the capacitance detection circuit 10 will be described. Based on the first voltage or the second voltage connected to the first capacitor to be measured, the capacitance detection circuit 10 is divided into a positive process and a negative process:

For the positive process, in the first phase, the third switch unit 15 is turned off, the fourth switch unit 112 is in the first closed state, the first capacitor to be measured is connected to the first voltage, the first drive module 11 charges the first capacitor to be measured to the first voltage, the fifth switch unit 161 is in the first closed state, the two terminals of the first offset capacitor are respectively connected to the fourth voltage and the fifth voltage to form a charging branch, and the first offset capacitor is charged to the fifth voltage; in the second phase, the third switch unit 15 is still turned off, the fourth switch unit 112 is turned off, the fifth switch unit 161 is in the second closed state, in this regard, the first offset capacitor discharges the first capacitor to be measured to perform charge offset, and part of the charge of the first capacitor to be measured transfers to the first offset capacitor; and in the third phase, the third switch unit 15 is turned on, the first capacitor to be measured is connected to the conversion module 12, the fourth switch unit 112 is turned off, the fifth switch unit 161 is in the second closed state, the conversion module 12 performs charge conversion processing on the first capacitor to be measured to generate the output voltage, and the processing module 13 determines the capacitance change of the first capacitor to be measured based on the output voltage of the conversion module.

For the negative process, in the first phase, the third switch unit 15 is turned off, the fourth switch unit 112 is in the second closed state, the first capacitor to be measured is discharged to the third voltage, the fifth switch unit 161 is in the first closed state, the two terminals of the first offset capacitor are respectively connected to the fourth voltage and the fifth voltage to form a charging branch, and the first offset capacitor is charged to the fifth voltage; in the second phase, the third switch unit 15 is still turned off, the fourth switch unit 112 is turned off, the fifth switch unit 161 is in the second closed state, in this regard, the first offset capacitor charges the first capacitor to be measured to perform charge offset, part of the charge of the first offset capacitor transfers to the first capacitor to be measured, and the first capacitor to be measured is charged to the seventh voltage; and in the third phase, the third switch unit 15 is turned on, the first capacitor to be measured is connected to the conversion module 12, the fourth switch unit 112 is turned off, the fifth switch unit 161 is in the second closed state, the conversion module 12 performs charge conversion processing on the first capacitor to be measured to generate the output voltage, and the processing module 13 determines the capacitance change of the first capacitor to be measured based on the output voltage of the conversion module.

Combining the positive process and the negative process, the first offset capacitor may discharge or charge the first capacitor to be measured to the common mode voltage Vcm; if there is no finger approaching, the capacitance value Cx of the first capacitor to be measured may not change. In the third phase, the output of the conversion module 12 may not change (zero); if an object approaches the first capacitor to be measured, Cx may change, which is recorded as Cx+ΔC, where ΔC is the capacitance change caused by the object approaching the first capacitor to be measured. As the first capacitor to be measured becomes larger, the output of the conversion module 12 may change (not zero) during the third phase of detection.

Figure 10:
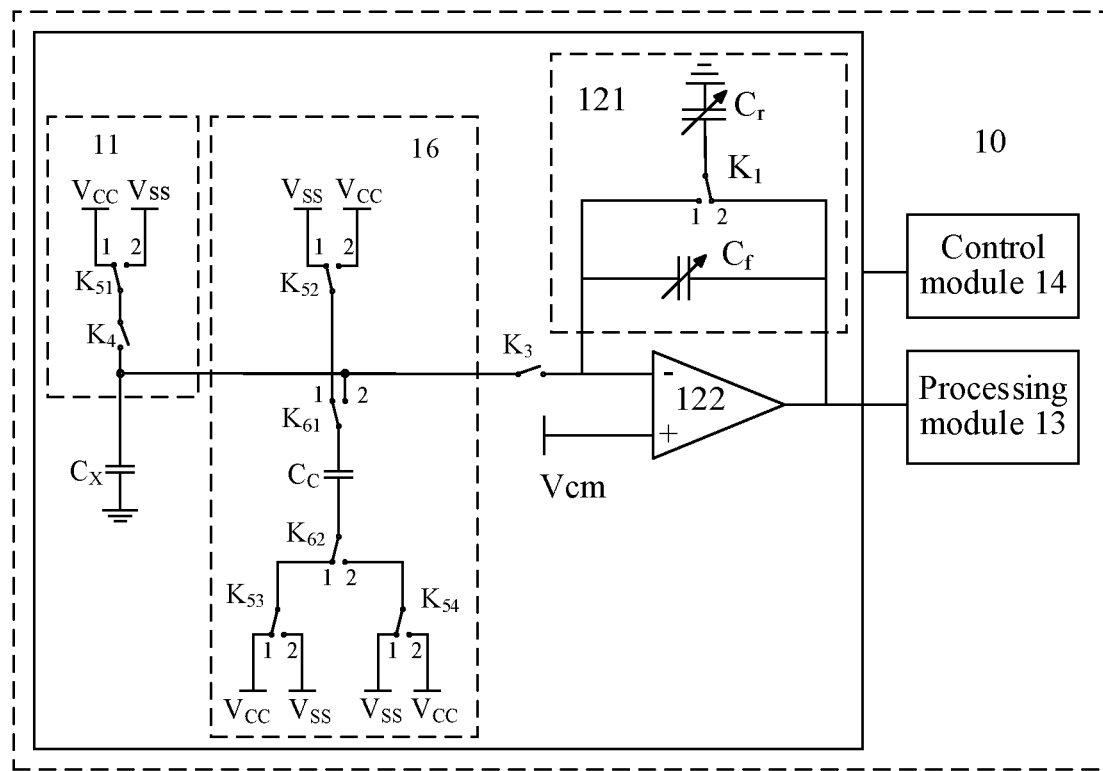
FIG. 10 is a structural diagram of a capacitance detection circuit provided by an embodiment of the present disclosure.

FIG. 10 is a structural diagram of a capacitance detection circuit provided by an embodiment of the present disclosure, in the present embodiment, the capacitance detection circuit 10 is a self-capacitance detection circuit, and the differential amplifier included in the conversion module 12 is the single-ended differential amplifier 122. In FIG. 10, the first switch unit 1211 may include the first switch $K_1$; the second switch unit 1241 may include the second switch $K_2$; the third switch unit 15 is $K_3$; the fourth switch unit 112 may include a fourth switch $K_4$, and may also include a fifth switch $K_{51}$; the fifth switch unit 161 may include three fifth switches $K_{52}$, $K_{53}$, and $K_{54}$, and may also include two sixth switches $K_{61}$ and $K_{62}$; and a seventh switch unit 171 may include a seventh switch $K_7$, and may also include an eighth switch $K_{81}$.

The capacitance detection circuit in FIG. 10 includes the first drive module 11, the conversion module 12, the first suppression module 121 and the first offset module 16. The first drive module 11, the conversion module 12, and the first suppression module 121 are the same as those in Embodiment 4. In the first offset module 16, the fifth switch unit 161 includes three fifth switches $K_{52}$, $K_{53}$, and $K_{54}$, and two sixth switches $K_{61}$ and $K_{62}$. In the present embodiment, the fourth voltage and the sixth voltage are both Vss, and the fifth voltage and the seventh voltage are both Vcc. The fifth switch $K_{52}$ may connect the first terminal and the third terminal or connect the second terminal and the third terminal by switching between the first terminal and the second terminal. The first terminal of the fifth switch $K_{52}$ is connected to Vss, a second terminal of the fifth switch $K_{52}$ is connected to Vcc, the third terminal of the fifth switch $K_{52}$ is connected to a first terminal of the sixth switch $K_{61}$, a second terminal of the sixth switch $K_{61}$ is connected to the first terminal of the first capacitor to be measured Cx, a third terminal of the sixth switch $K_{61}$ is electrically connected to the first terminal of the first offset capacitor Cc, and the sixth switch $K_{61}$ may connect the first terminal and the third terminal or connect the second terminal and the third terminal by switching between the first terminal and the second terminal. The second terminal of the first offset capacitor Cc is electrically connected to a third terminal of the sixth switch $K_{62}$, and the sixth switch $K_{62}$ may connect the first terminal and the third terminal or connect the second terminal and the third terminal by switching between the first terminal and the second terminal. A first terminal of the sixth switch $K_{62}$ and a third terminal of the fifth switch $K_{53}$ are electrically connected, and the first terminal of the sixth switch $K_{62}$ and a third terminal of the fifth switch $K_{54}$ are electrically connected. The fifth switch $K_{53}$ may connect the first terminal and the third terminal or connect the second terminal and the third terminal by switching between the first terminal and the second terminal, the fifth switch $K_{54}$ may connect the first terminal and the third terminal or connect the second terminal and the third terminal by switching between the first terminal and the second terminal, the first terminal of the fifth switch $K_{53}$ is connected to Vcc, a second terminal of the fifth switch $K_{53}$ is connected to Vss, the first terminal of the fifth switch $K_{54}$ is connected to Vss, and a second terminal of the fifth switch $K_{54}$ is connected to Vss.

It should be noted that the fifth switches ($K_{52}$, $K_{53}$, and $K_{54}$) are all switched to the first terminal, connecting their respective first and third terminals, and the sixth switches ($K_{61}$ and $K_{62}$) are all switched to the first terminal, connecting their respective first and third terminals, in this regard, the fifth switch unit 161 is in the first closed state; the fifth switches ($K_{52}$, $K_{53}$, and $K_{54}$) are all switched to the first terminal, connecting their respective first and third terminals, and the sixth switches ($K_{61}$ and $K_{62}$) are all switched to the second terminal, connecting their respective second and third terminals, in this regard, the fifth switch unit 161 is in the second closed state; the fifth switches ($K_{52}$, $K_{53}$, and $K_{54}$) are all switched to the second terminal, connecting their respective first and third terminals, and the sixth switches ($K_{61}$ and $K_{62}$) are all switched to the first terminal, connecting their respective first and third terminals, in this regard, the fifth switch unit 161 is in the first closed state; and the fifth switches ($K_{52}$, $K_{53}$, and $K_{54}$) are all switched to the second terminal, connecting their respective first and third terminals, and the sixth switches ($K_{61}$ and $K_{62}$) are all switched to the second terminal, connecting their respective second and third terminals, in this regard, the fifth switch unit 161 is in the second closed state.

Figure 11:
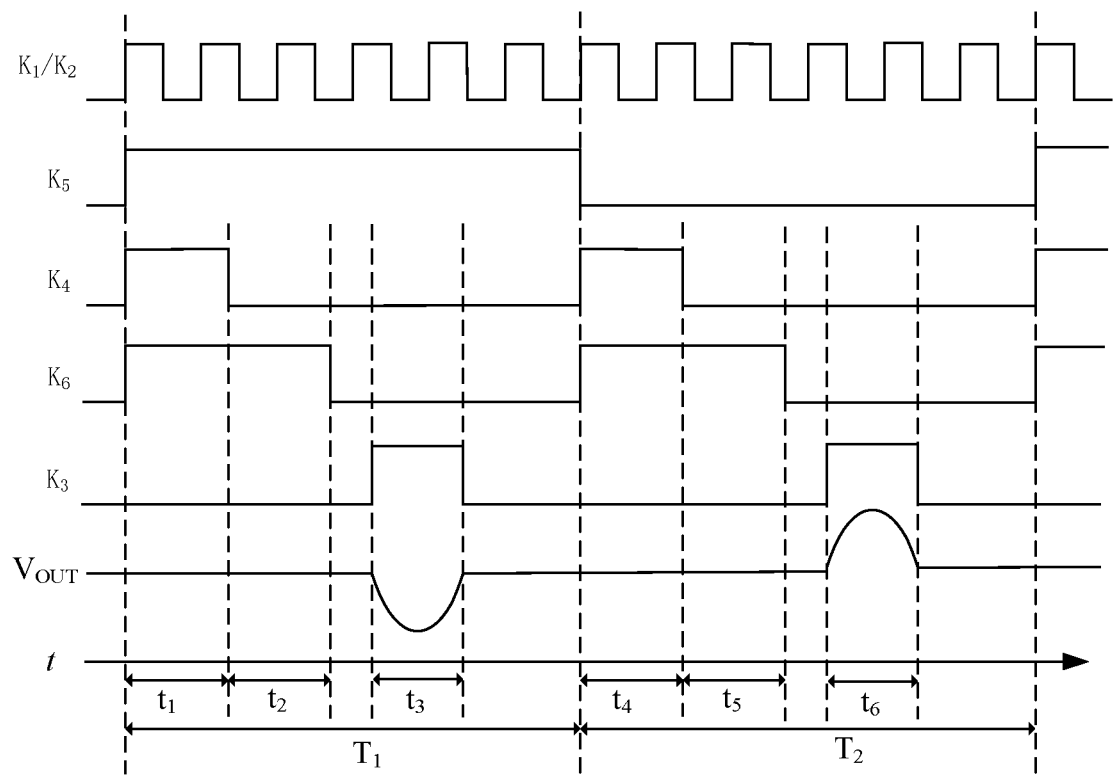
FIG. 11 is a control sequence diagram provided by an embodiment of the present disclosure.

With reference to FIG. 11, FIG. 11 is a control sequence diagram provided by an embodiment of the present disclosure. Based on Vcc or Vss connected to the first capacitor to be measured, the capacitance detection circuit 10 is divided into a positive process and a negative process:

For the positive process, corresponding to $T_1$ period in FIG. 11, all the fifth switches ($K_{51}$, $K_{52}$, $K_{53}$ and $K_{54}$) in the positive process are switched to the first terminal, connecting their respective first and third terminals, the first switch $K_1$ and the second switch $K_2$ are periodically turned on and turned off, for the first phase ($t_1$ period in FIG. 11), that is, the charging phase, the third switch unit 15$K_3$ is turned off, and the fourth switch $K_4$ is in the closed state, in this regard, the first capacitor to be measured Cx is charged to Vcc, the sixth switches ($K_{61}$ and $K_{62}$) are all switched to the first terminal, connecting their respective first and third terminals, and the first offset capacitor Cc is charged; for the second phase ($t_2$ period in FIG. 11), that is, the offset phase, the third switch unit 15$K_3$ is turned off, the fourth switch $K_4$ is in the open state, the sixth switches ($K_{61}$ and $K_{62}$) are all switched to the second terminal, connecting their respective second and third terminals, in this regard, the first offset capacitor Cc discharges the first capacitor to be measured Cx to perform charge offset; and for the third phase ($t_3$ period in FIG. 11), that is, the charge transfer phase, the third switch unit 15$K_3$ is turned off, the fourth switch $K_4$ is in the open state, the sixth switches ($K_{61}$ and $K_{62}$) are all switched to the second terminal, connecting their respective second and third terminals, in this regard, the conversion module 12 performs charge conversion processing on the first capacitor to be measured Cx to generate the output voltage.

For the negative process, corresponding to $T_2$ period in FIG. 11, all the fifth switches ($K_{51}$, $K_{52}$, $K_{53}$ and $K_{54}$) in the negative process are switched to the second terminal, connecting their respective second and third terminals, the first switch $K_1$ and the second switch $K_2$ are periodically turned on and turned off, for the first phase ($t_4$ period in FIG. 11), that is, the discharging phase, the third switch unit 15$K_3$ is turned off, and the fourth switch $K_4$ is in the closed state, in this regard, the first capacitor to be measured Cx is discharged to Vss, the sixth switches ($K_{61}$ and $K_{62}$) are all switched to the first terminal, connecting their respective first and third terminals, and the first offset capacitor Cc is charged; for the second phase ($t_5$ period in FIG. 11), that is, the charging phase, the third switch unit 15$K_3$ is turned off, the fourth switch $K_4$ is in the open state, the sixth switches ($K_{61}$ and $K_{62}$) are all switched to the second terminal, connecting their respective second and third terminals, in this regard, the first offset capacitor Cc charges the first capacitor to be measured Cx to perform charge offset; and for the third phase ($t_6$ period in FIG. 11), that is, the charge transfer phase, the third switch unit 15$K_3$ is connected, the fourth switch $K_4$ is in the open state, the sixth switches ($K_{61}$ and $K_{62}$) are all switched to the second terminal, connecting their respective second and third terminals, in this regard, the conversion module 12 performs charge conversion processing on the first capacitor to be measured Cx to generate the output voltage.

It should be noted that the switching frequency of the first switch unit 1211 is greater than twice the power supply frequency, to suppress the signal with the frequency that is less than the first frequency or greater than the second frequency. In Embodiment 6, the capacitance detection circuit is a self-capacitance circuit, and the power supply frequency refers to the switching frequency at which the third switch unit 15 is turned on and turned off. The turn-on or turn-off of the third switch unit 16 is controlled by the fourth switch $K_4$. The first switch unit 1211 is the first switch $K_1$. Therefore, in the present embodiment, the switching frequency of the first switch unit 1211 being greater than twice the power supply frequency means that the switching frequency of the first switch $K_1$ between the first terminal and the second terminal is greater than twice the switching frequency at which the fourth switch $K_4$ is turned on and turned off.

Figure 12:
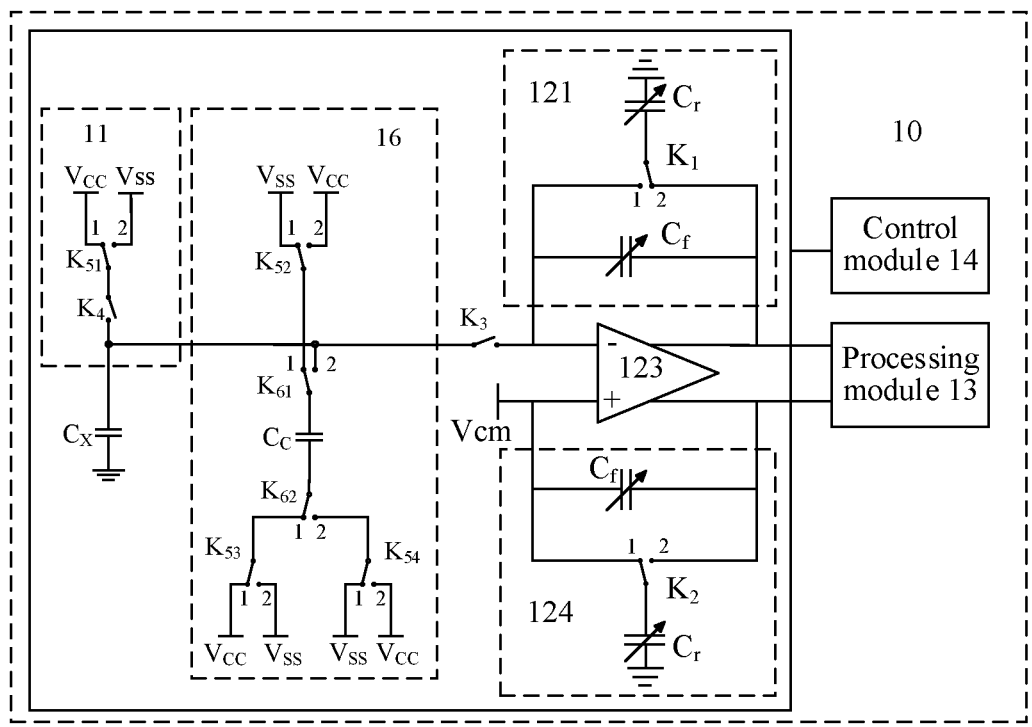
FIG. 12 is a structural diagram of a capacitance detection circuit provided by an embodiment of the present disclosure.

FIG. 12 is a structural diagram of a capacitance detection circuit provided by an embodiment of the present disclosure. When the differential amplifier is a double-ended differential amplifier, as shown in FIG. 12, the capacitance detection circuit 10 is a self-capacitance detection circuit, and the differential amplifier included in the conversion module 12 is the double-ended differential amplifier 123. The capacitance detection circuit 10 in the present embodiment includes the first drive module 11, the conversion module 12, the first suppression module 121, the first offset module 16 and the second suppression module 124. Here, the first drive module 11, the conversion module 12, the first suppression module 121, and the first offset module 16 are the same as those in Embodiment 6, and detailed description thereof will be omitted. In the second suppression module 124, the first terminal and the second terminal of the second switch $K_2$ are respectively connected to the non-inverting input terminal and the second output terminal of the double-ended differential amplifier 123, the two terminals of the fourth capacitor 1243$C_f$ are respectively connected to the first terminal of the second switch $K_2$ and the second terminal of the second switch $K_2$, the first terminal of the third capacitor 1242$C_r$ is electrically connected to the third terminal of the second switch unit 1241, and the second terminal of the third capacitor 1242$C_r$ is grounded. In the present embodiment, the capacitance values of the first capacitor 1212 and the third capacitor 1242 are the same as $C_r$, and the capacitance values of the second capacitor 1213 and the fourth capacitor 1243 are the same as $C_f$.

The capacitance detection circuit 10 described in Embodiment 6 and Embodiment 7 is suitable for the case where the self-capacitance of the first capacitor to be measured is large, because the self-capacitance of the first capacitor to be measured is large, therefore, it has a large impact on the capacitance detection. The self-capacitance of the first capacitor to be measured is offset by the first offset module 16, and the change ΔC of the first capacitor to be measured when an object approaches may be detected more accurately.

Figure 13:
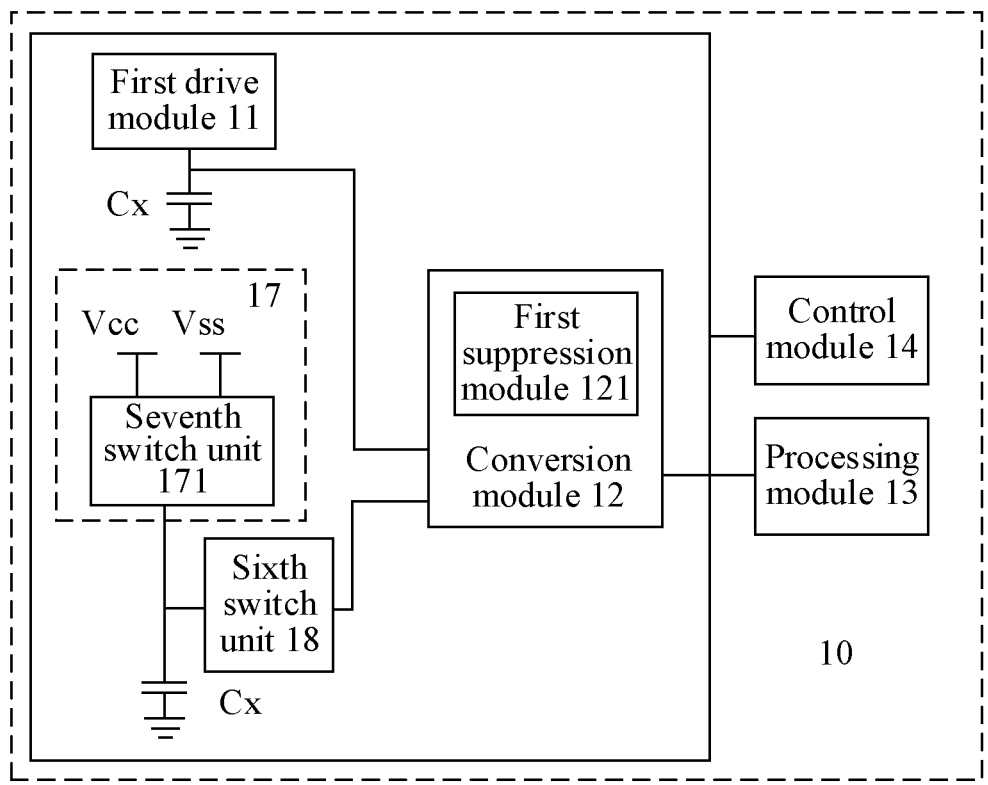
FIG. 13 is a structural diagram of a capacitance detection circuit provided by an embodiment of the present disclosure.

FIG. 13 is a structural diagram of a capacitance detection circuit provided by an embodiment of the present disclosure, alternatively, in an embodiment of the present disclosure, as shown in FIG. 13, the capacitance detection circuit 10 further includes the second drive module 17, the second drive module 17 is electrically connected to the second input terminal of the conversion module 12, and the control module 14 is further configured to control the second drive module 17 to charge a second capacitor to be detected; and the conversion module 12 is configured to perform charge conversion processing on the second capacitor to be detected to generate an output voltage.

Alternatively, in an embodiment of the present disclosure, as shown in FIG. 13, the capacitance detection circuit 10 further includes a sixth switch unit 18, the sixth switch unit 18 is connected between the second drive module 17 and the second input terminal of the conversion module 12, and when the sixth switch unit 18 is turned on, the conversion module 12 performs charge conversion processing on the second capacitor to be detected to generate the output voltage.

Alternatively, as shown in FIG. 13, the second drive module 17 includes a seventh switch unit 171, and the control module 14 is further configured to control the seventh switch unit 171 to be in a first closed state so that the second drive module 18 charges the second capacitor to be detected; and when the seventh switch unit 171 is in the first closed state, a first terminal of the second capacitor to be detected is connected to an eighth voltage through the seventh switch unit 171, a second terminal of the second capacitor to be detected is connected to a ninth voltage, and the eighth voltage is greater than the ninth voltage.

Alternatively, the control module 14 is further configured to control the seventh switch unit 171 to be in a second closed state to discharge the second capacitor to be detected; and when the seventh switch unit 171 is in the second closed state, the first terminal of the second capacitor to be detected is connected to a tenth voltage through the seventh switch unit 171, the second terminal of the second capacitor to be detected is connected to the ninth voltage, and the ninth voltage is greater than the tenth voltage. The principle and structure of the second drive module 17 are the same as those of the first drive module 11, and detailed description thereof will be omitted.

Figure 14:
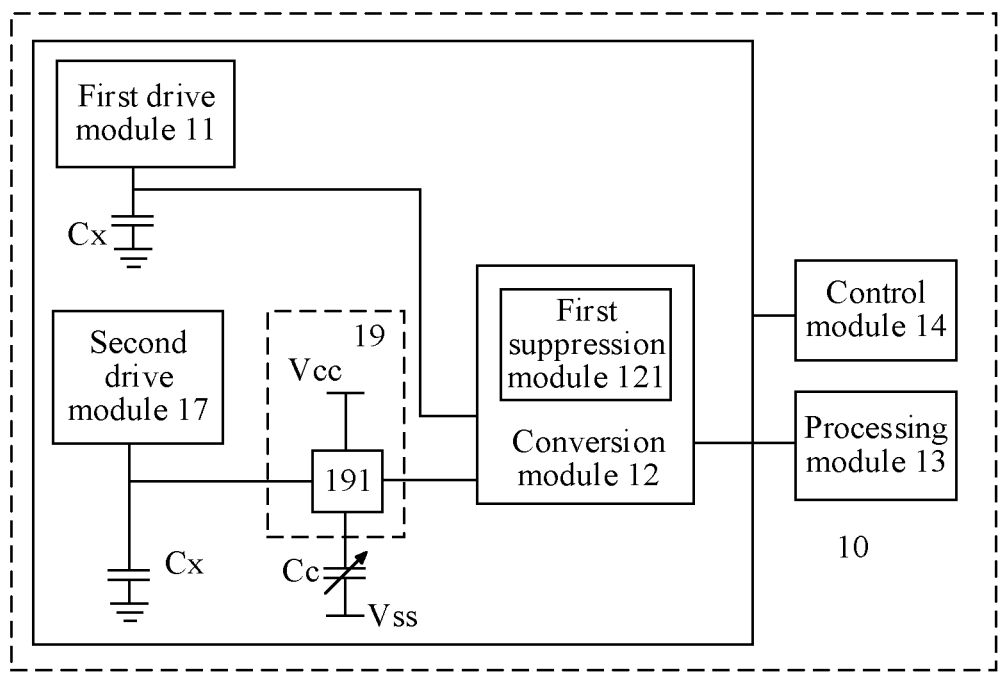
FIG. 14 is a structural diagram of a capacitance detection circuit provided by an embodiment of the present disclosure.

FIG. 14 is a structural diagram of a capacitance detection circuit provided by an embodiment of the present disclosure, alternatively, in an embodiment of the present disclosure, as shown in FIG. 14, the capacitance detection circuit 10 further includes a second offset module 19; and the control module 14 is further configured to control the second offset module 19 to charge a second offset capacitor, and to control the second offset capacitor to charge or discharge the second capacitor to be detected to perform charge offset.

Alternatively, as shown in FIG. 14, the second offset module 19 includes an eighth switch unit 191, and the control module 14 is further configured to control the eighth switch unit 191 to be in the first closed state to form a charging branch so that the offset module charges the second offset capacitor; and the control module 14 is further configured to control the eighth switch unit 191 to be in the second closed state to form an offset branch so that the second offset capacitor charges or discharges the second capacitor to be detected to perform charge offset.

Alternatively, when the eighth switch unit 191 is in the first closed state, two terminals of the second offset capacitor are respectively connected to an eleventh voltage and a twelfth voltage, and the twelfth voltage is greater than the eleventh voltage.

Alternatively, when the eighth switch unit 191 is in the second closed state, a first terminal of the second offset capacitor is electrically connected to the first terminal of the second capacitor to be detected through the eighth switch unit 191, a second terminal of the second offset capacitor is connected to a thirteenth voltage or a fourteenth voltage through the eighth switch unit 191, the thirteenth voltage is less than the ninth voltage connected to the second terminal of the second capacitor to be detected, and the fourteenth voltage is greater than the ninth voltage connected to the second terminal of the second capacitor to be detected. The principle and structure of the second offset module 19 are the same as those of the first offset module 16, and detailed description thereof will be omitted.

The capacitance detection circuit, the detection chip, and the electronic device of the embodiments of the present disclosure, suppress the interference signal with the frequency that is less than the first frequency or greater than the second frequency using the first suppression module 121, when the output voltage is generated by the conversion module 12, thereby reducing the influence of the interference signal, and improving the sensitivity and accuracy of capacitance detection.

Figure 15:
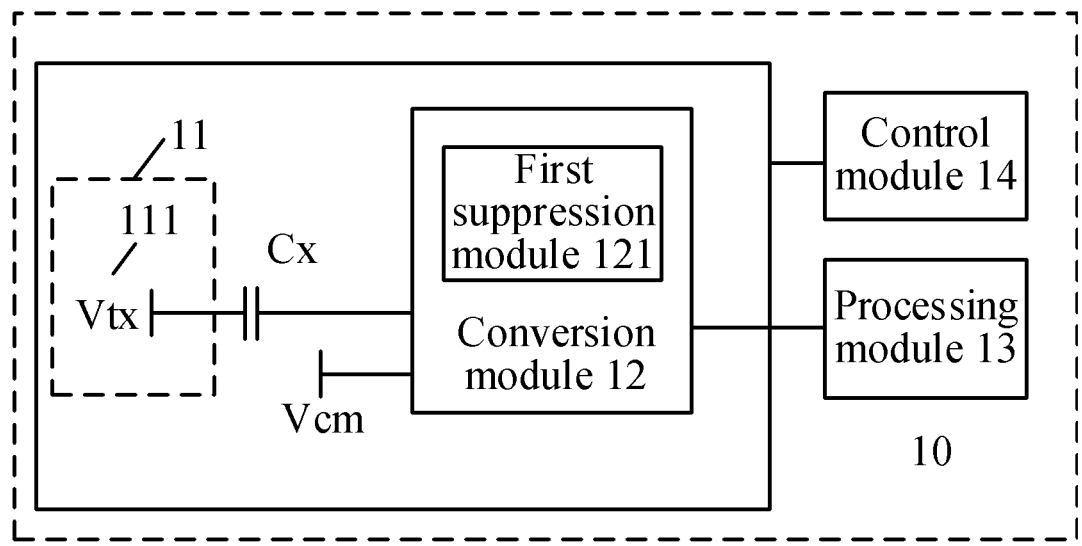
FIG. 15 is a structural diagram of a capacitance detection circuit provided by an embodiment of the present disclosure.
Figure 16:
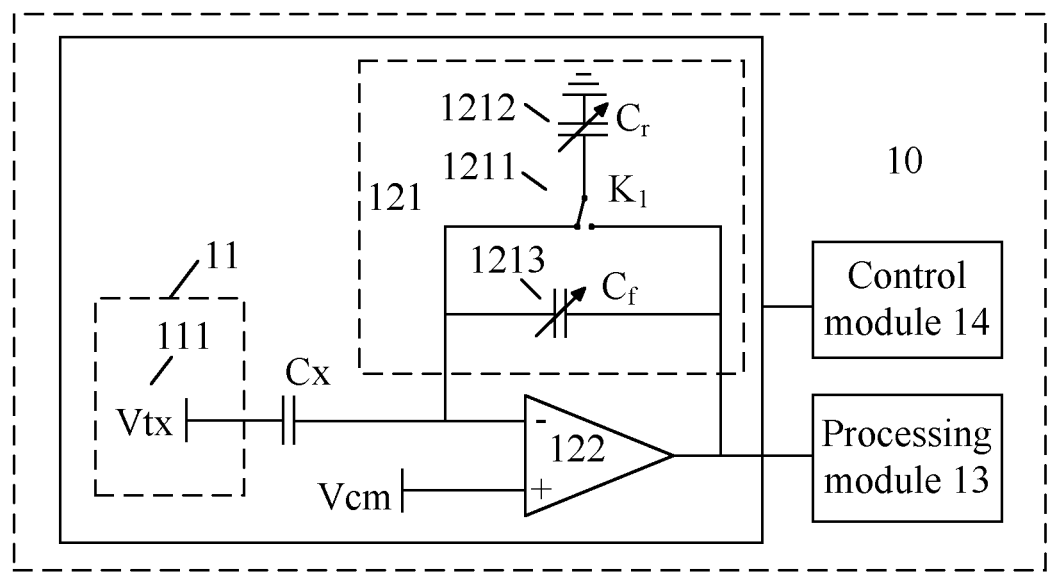
FIG. 16 is a structural diagram of a capacitance detection circuit provided by an embodiment of the present disclosure.
Figure 17:
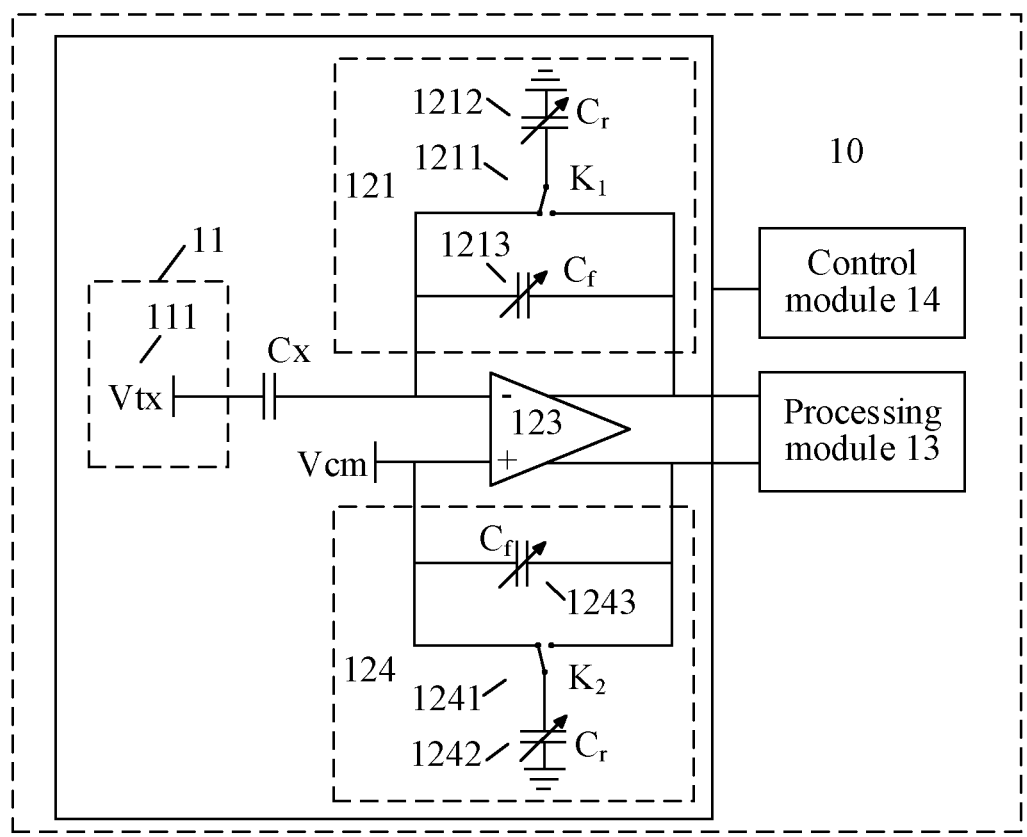
FIG. 17 is a structural diagram of a capacitance detection circuit provided by an embodiment of the present disclosure.

Embodiment 2, the capacitance detection circuit when applied to self-capacitance detection (FIG. 15 to FIG. 17)

As shown in FIG. 15, FIG. 15 is a structural diagram of a capacitance detection circuit provided by an embodiment of the present disclosure. As shown in FIG. 15, the capacitance detection circuit 10 includes: a first drive module 11, a first suppression module 121, a conversion module 12, a processing module 13, and a control module 14; the first drive module 11 is configured to charge a first capacitor to be measured Cx; the conversion module 12 is configured to perform charge conversion processing on the first capacitor to be measured to generate an output voltage, the control module 14 is configured to control the first suppression module 121 to suppress an interference signal with a frequency that is less than a first frequency or greater than a second frequency when the conversion module 12 generates the output voltage, and the second frequency is greater than the first frequency; and the processing module 13 is configured to determine a capacitance change before and after the first capacitor to be measured is affected by an applied electric field based on the output voltage.

When the capacitance detection circuit 10 operates, the first drive module 11 charges the first capacitor to be measured, the conversion module 12 performs charge conversion processing on the first capacitor to be measured to generate the output voltage, and the conversion module 12 performs conversion processing on charge transferred by the first capacitor to be measured to generate the output voltage. In this regard, the first suppression module 121 suppresses a signal with a frequency that is less than the first frequency or greater than the second frequency. When an object approaches the first capacitor to be measured, the capacitance of the first capacitor to be measured changes. In this regard, the charge transferred from the first capacitor to be measured to the conversion module changes, and the output voltage output by the conversion module changes. In this way, it may be detected that an object is approaching the first capacitor to be measured.

As shown in FIG. 15, the first drive module 11 includes an excitation power supply 111Vtx, and the excitation power supply 111Vtx is electrically connected to the first input terminal of the conversion module 12 through the first capacitor to be measured. In a mutual capacitance detection circuit, the excitation power supply 111 in the first drive module 11 charges the first capacitor to be measured, and the first capacitor to be measured transfers charge to the conversion module 12. When an object that may generate an applied electric field approaches the first capacitor to be measured, the overall capacitance in the circuit becomes smaller, and the charge transferred from the first capacitor to be measured to the conversion module becomes less, and the output voltage of the transfer module decreases.

Here, it should be noted that, in the mutual capacitance circuit, the driving frequency refers to the frequency of the excitation power supply 111. The first suppression module 121 suppresses the electrical signal with the frequency less than the first frequency mainly for the interference signal generated by the power supply. Typically, the interference signal generated by the power supply is within 50 Hz. Therefore, the first frequency may be 50 Hz. Of course, here is only an exemplary description.

In the above embodiment involving offset processing, it is especially suitable for self-capacitance detection. Since the self-capacitance has a large basic capacitance, it is detected that the self-capacitance has a small capacitance change under the influence of an applied electric field. Through the above offset processing, the influence of the basic capacitance of the self-capacitance may be eliminated, so that the output of the conversion module reflects as much as possible the capacitance change caused by the applied electric field, thereby further improving the sensitivity and accuracy of detection. In the above embodiment, the first offset capacitor used in the offset module is preferably a capacitor with a constant capacitance, and its capacitance does not change with changes in the external environment, such as being affected by pressure, temperature, or humidity.

FIG. 16 is a structural diagram of a capacitance detection circuit provided by an embodiment of the present disclosure. As shown in FIG. 16, the capacitance detection circuit 10 is a mutual capacitance detection circuit, and the differential amplifier included in the conversion module 12 is a single-ended differential amplifier 122. The first terminal of the first capacitor to be measured Cx is connected to the excitation power supply 111Vtx, the second terminal of the first capacitor to be measured Cx is connected to an inverting input terminal of the single-ended differential amplifier 122, a non-inverting input terminal of the single-ended differential amplifier 122 is connected to a common mode voltage Vcm, and an output terminal of the single-ended differential amplifier 122 (that is, the first output terminal of the single-ended differential amplifier 122) is connected to the processing module 13. In the first suppression module 121, a first terminal and a second terminal of a first switch $K_1$ are respectively connected to the inverting input terminal and the output terminal of the single-ended differential amplifier 122, a first capacitor 1212 may be respectively connected to the first terminal of the first switch $K_1$ and the second terminal of the first switch $K_1$ through a third terminal of the first switch $K_1$, a second terminal of a first capacitor 1212$C_r$ is grounded, and two terminals of a second capacitor 1213$C_f$ are respectively connected to the inverting input terminal and the output terminal of the single-ended differential amplifier 122.

FIG. 17 is a structural diagram of a capacitance detection circuit provided by an embodiment of the present disclosure. As shown in FIG. 17, in the present embodiment, the capacitance detection circuit 10 is a mutual capacitance detection circuit, and the differential amplifier included in the conversion module 12 is a double-ended differential amplifier 123. The first terminal of the first capacitor to be measured Cx is connected to the excitation power supply 111Vtx, the second terminal of the first capacitor to be measured Cx is connected to an inverting input terminal of the double-ended differential amplifier 123, an non-inverting input terminal of the double-ended differential amplifier 123 is connected to the common mode voltage Vcm, and a first output terminal and a second output terminal of the double-ended differential amplifier 123 are connected to the processing module 13. In the first suppression module 121, the first terminal and the second terminal of the first switch $K_1$ are respectively connected to the inverting input terminal and the first output terminal of the double-ended differential amplifier 123, the first capacitor 1212 may be respectively connected to the first terminal of the first switch $K_1$ and the second terminal of the first switch $K_1$ through the third terminal of the first switch $K_1$, the second terminal of the first capacitor 1212$C_r$ is grounded, and the two terminals of the second capacitor 1213$C_f$ are respectively connected to the inverting input terminal and the first output terminal of the double-ended differential amplifier 123. In the second suppression module 124, a first terminal and a second terminal of a second switch $K_2$ are respectively connected to the non-inverting input terminal and the second output terminal of the double-ended differential amplifier 123, two terminals of a fourth capacitor 1243$C_f$ are respectively connected to the first terminal of the second switch $K_2$ and the second terminal of the second switch $K_2$, a first terminal of a third capacitor 1242$C_r$ is electrically connected to a third terminal of a second switch unit 1241, and a second terminal of the third capacitor 1242$C_r$ is grounded. In the present embodiment, the capacitance values of the first capacitor 1212 and the third capacitor 1242 are the same as $C_r$, and the capacitance values of the second capacitor 1213 and the fourth capacitor 1243 are the same as $C_f$.

Embodiment 3

The embodiment of the present disclosure provides a detection chip, including the capacitance detection circuit 10 as described in any one of Embodiment 1 and Embodiment 2.

Embodiment 4

The embodiment of the present disclosure provides an electronic device, including the detection chip as described in Embodiment 3.

The capacitance detection circuit, the detection chip, and the electronic device of the embodiments of the present disclosure, suppress the interference signal with the frequency that is less than the first frequency or greater than the second frequency using the first suppression module, when the output voltage is generated by the conversion module, thereby reducing the influence of the interference signal, and improving the sensitivity and accuracy of capacitance detection.

The above products may perform the method provided in the embodiments of the present disclosure, and have corresponding functional modules and beneficial effects for performing the method. For technical details not described in detail in the present embodiment, reference may be made to the method provided in the embodiments of the present disclosure.

The electronic device of the embodiment of the present disclosure takes in various forms, including but is not limited to:

(1) Mobile communication device: this type of device is characterized by mobile communication function, and its main goal is to provide voice and data communication. Such terminals include: smart phones (such as iPhone), multimedia cellphones, feature cellphones, low-end cellphones or the like.

(2) Ultra-mobile personal computer device: this type of device belongs to the category of personal computer, has computing and processing functions, and generally has mobile Internet access characteristics. Such terminals include: PDAs, MIDs, and UMPC devices, such as iPad.

(3) Portable entertainment equipment: this type of device may display and play multimedia content. Such devices include: audio and video players (such as iPod), hand-held game consoles, e-books, smart toys and portable vehicle-mounted navigation devices.

(4) Server: equipment that provides computing services. The server includes a processor 810, a hard disk, a memory, a system bus, etc. The server is similar in architecture to a general-purpose computer. However, due to the need to provide highly reliable services, the server has high requirements in terms of processing power, stability, reliability, security, scalability, and manageability.

(5) Other electronic apparatuses having data interaction functions.

So far, specific embodiments of the present subject matter have been described. Other embodiments are within the scope of the appended claims. In some cases, the actions recited in the claims may be performed in a different order and still achieve the desired result. In addition, the processes depicted in the accompanying drawings do not necessarily require the particular order or sequential order shown to achieve the desired result. In some embodiments, multitasking and parallel processing may be advantageous.

In the 1990s, for a technical improvement, it can be clearly distinguished whether it is an improvement in hardware (for example, an improvement in circuit structure such as diode, transistor, or switch) or an improvement in software (an improvement on method flow). However, with the development of technology, today, many method flow improvements may be regarded as direct improvements in the hardware circuit structure. Designers almost always get the corresponding hardware circuit structure by programming the improved method flow into the hardware circuit. Therefore, it cannot be said that an improvement on the method flow cannot be realized by a hardware entity module. For example, a programmable logic device (PLD) (such as a field programmable gate array (FPGA)) is such an integrated circuit whose logic function is determined by the user programming the device. Designers themselves may program to "integrate" a digital system on a piece of PLD, without having to ask a chip manufacturer to design and manufacture a dedicated integrated circuit chip. Moreover, nowadays, instead of manufacturing integrated circuit chips manually, this programming is also mostly implemented using "logic compiler" software, which is similar to the software compiler used in program development and writing. To compile the original source code, it has to be written in a specific programming language, which is called hardware description language (HDL). There is not only one type of HDL, but many types, such as ABEL (Advanced Boolean Expression Language), AHDL (Altera Hardware Description Language), Confluence, CUPL (Cornell University Programming Language), HDCal, JHDL (Java Hardware Description Language), Lava, Lola, MyHDL, PALASM, or RHDL (Ruby Hardware Description Language). Currently the most commonly used are VHDL (Very-High-Speed Integrated Circuit Hardware Description Language) and Verilog. Those skilled in the art should also be clear that as long as the method flow is slightly logical programmed and programmed into the integrated circuit using the above-mentioned several hardware description languages, a hardware circuit that implements the logic method flow may be easily obtained.

A controller may be implemented in any suitable method, for example, the controller may take the form of a microprocessor or processor and a computer-readable medium storing computer-readable program codes (such as software or firmware) executable by the (micro) processor, logic gate, switch, application specific integrated circuit (ASIC), programmable logic controller, and embedded microcontroller. Examples of the controller include, but are not limited to, the following microcontrollers: ARC 625D, Atmel AT91SAM, Microchip PIC18F26K20 and Silicone Labs C8051F320. A memory controller may also be implemented as part of the control logic for the memory. Those skilled in the art also know that, in addition to implementing the controller in the purely computer-readable program code method, it is entirely possible to logical program method steps to make the controller achieve the same functions in the form of logic gate, switch, application specific integrated circuit, programmable logic controller, and embedded microcontroller. Therefore, such controller may be regarded as a hardware component, and an apparatus for implementing various functions included in the controller may also be regarded as a structure within the hardware component. Or even, the apparatus for implementing various functions may be regarded as a structure that may be both a software module implementing the method and a hardware component.

The system, apparatus, module, or unit described in the foregoing embodiments may be specifically implemented by a computer chip or entity, or by a product having a certain function. A typical implementation device is a computer. Specifically, the computer may be, for example, a personal computer, a laptop computer, a cellular phone, a camera phone, a smart phone, a personal digital assistant, a media player, a navigation device, an email device, a game console, a tablet computer, a wearable device, or a combination of any of these devices.

For the convenience of description, when describing the above apparatus, the functions are divided into various units and described separately. Of course, when implementing the present disclosure, the functions of the units may be implemented in the same or a plurality of software and/or hardware.

Those skilled in the art should understand that the embodiments of the present disclosure may be provided as a method, a system, or a computer program product. Therefore, the present disclosure may take the form of an entirely hardware embodiment, an entirely software embodiment, or an embodiment combining software and hardware aspects.

Moreover, the present disclosure may take the form of a computer program product implemented on one or more computer-usable storage mediums (including but not limited to disk memory, CD-ROM, optical memory, etc.) containing computer-usable program codes.

The present disclosure is described with reference to flowcharts and/or block diagrams of the method, device (system), and computer program product according to the embodiments of the present disclosure. It should be understood that each flow and/or block in the flowcharts and/or block diagrams, and combinations of flows and/or blocks in the flowcharts and/or block diagrams may be implemented by computer program instructions. These computer program instructions may be provided to a processor of a general-purpose computer, dedicated computer, embedded processor, or other programmable data processing device to produce a machine, such that instructions executed by the processor of the computer or other programmable data processing device produce an apparatus for implementing the functions specified in one or more flows in the flowcharts and/or one or more blocks in the block diagrams.

These computer program instructions may also be stored in a computer-readable memory capable of directing the computer or other programmable data processing device to work in a specific method such that the instructions stored in the computer-readable memory produce a product that includes an instruction apparatus that implements the functions specified in one or more flows in the flowcharts and/or one or more blocks in the block diagrams.

These computer program instructions may also be loaded onto the computer or other programmable data processing device, such that a series of operation steps may be performed on the computer or other programmable device to produce a computer-implemented process, such that the instructions executed on the computer or other programmable device provide steps for implementing the functions specified in one or more flows in the flowcharts and/or one or more blocks in the block diagrams.

In a typical configuration, a computing device includes one or more processors (CPUs), input/output interfaces, network interfaces, and memories.

The memory may include non-persistent memory, random access memory (RAM), and/or non-volatile memory in computer-readable medium, such as read-only memory (ROM) or flash read-only memory (flash RAM). Memory is an example of the computer-readable medium.

Computer-readable medium includes both permanent and non-persistent, removable and non-removable media. Information may be stored by any method or technology. Information may be computer-readable instructions, data structures, program modules, or other data. Examples of computer storage medium include, but are not limited to, phase-change random access memory (PRAM), static random access memory (SRAM), dynamic random access memory (DRAM), other types of random access memory (RAM), read-only memory (ROM), electrically erasable programmable read-only memory (EEPROM), flash memory or other memory technologies, read-only disc read-only memory (CD-ROM), digital versatile disc (DVD) or other optical storage, magnetic tape cartridges, magnetic tape, magnetic disk storage or other magnetic storage devices, or any other non-transmission medium that may be used to store information that can be accessed by the computing device. As defined herein, the computer-readable medium does not include temporary computer-readable media (transitory media) such as modulated data signals and carrier waves.

It should also be noted that the terms "including," "comprising," or any other variation thereof are intended to encompass non-exclusive inclusion, such that a process, method, product, or device that includes a series of elements includes not only those elements but also other elements not explicitly listed, or those that are inherent to such process, method, product, or device. Without more restrictions, elements defined by the sentence "including a . . . " do not exclude the existence of other identical elements in the process, method, product or device including the said elements.

Those skilled in the art should understand that the embodiments of the present disclosure may be provided as a method, a system, or a computer program product. Therefore, the present disclosure may take the form of an entirely hardware embodiment, an entirely software embodiment, or an embodiment combining software and hardware aspects. Moreover, the present disclosure may take the form of a computer program product implemented on one or more computer-usable storage mediums (including but not limited to disk memory, CD-ROM, optical memory, etc.) containing computer-usable program codes.

The present disclosure may be described in the general context of computer-executable instructions executed by the computer, such as program modules. Generally, program modules include routines, programs, objects, components, data structures, etc. that perform specific transactions or implement specific abstract data types. The present disclosure may also be practiced in distributed computing environments in which transactions are executed by remote processing devices connected through communication networks. In a distributed computing environment, the program modules may be located in local and remote computer storage mediums including storage devices.

The embodiments in this specification are described in a progressive method, and the same or similar parts between the embodiments may refer to each other. Each embodiment focuses on the differences from other embodiments. Specifically, for the system embodiment, since it is basically similar to the method embodiment, the description thereof is relatively simple. For related details, it may refer to the part of description in the method embodiment.

The above description is merely embodiments of the present disclosure and is not intended to limit the present disclosure. For those skilled in the art, the present disclosure may have various modifications and changes. Any modification, equivalent replacement, improvement, etc. made within the spirit and principle of the present disclosure shall be included in the scope of the claims of the present disclosure.

What is claimed is:

1. A capacitance detection circuit, comprising: a first drive module, a conversion module, a processing module, and a control module; the first drive module being configured to supply a first voltage to a first capacitor to be measured to charge the first capacitor to be measured; the conversion module being configured to perform charge conversion processing on the first capacitor to be measured to generate an output voltage, the conversion module comprising a first suppression module, the control module being configured to control the first suppression module to suppress an interference signal with a frequency that is less than a first frequency or greater than a second frequency when the conversion module generates the output voltage, and the second frequency being greater than the first frequency; and the processing module being configured to determine a capacitance change before and after the first capacitor to be measured is affected by an applied electric field based on the output voltage;

wherein the conversion module has a first input terminal and a second input terminal, the first input terminal of the conversion module is electrically connected to the first drive module, and the second input terminal of the conversion module is connected to a common mode voltage;

wherein the conversion module comprises a differential amplifier, the first input terminal of the conversion module is an inverting input terminal of the differential amplifier, the second input terminal of the conversion module is a non-inverting input terminal of the differential amplifier, the first drive module is electrically connected to the inverting input terminal of the differential amplifier, the non-inverting input terminal of the differential amplifier is connected to the common mode voltage, and an output terminal of the differential amplifier is electrically connected to the processing module, and two terminals of the first suppression module are respectively connected to the inverting input terminal and the output terminal of the differential amplifier;

wherein the first suppression module comprises a first switch unit, a first capacitor, and a second capacitor, wherein the first switch unit comprises a first terminal, a second terminal and a third terminal, the first terminal and the second terminal of the first switch unit being directly connected to the inverting input terminal and the output terminal of the differential amplifier respectively, and the third terminal of the first switch unit being connected to a first terminal of the first capacitor; a second terminal of the first capacitor is grounded; and two terminals of the second capacitor are directly connected to the inverting input terminal and the output terminal of the differential amplifier respectively; and the control module is configured to control the first switch unit to switch between a first closed state in which the third terminal contacts the first terminal and a second closed state in which the third terminal contacts the second terminal, such that the first capacitor is alternately connected to the first terminal of the first switch unit and the second terminal of the first switch unit to suppress an electrical signal which has a frequency less than the first frequency, a switching frequency of the first switch unit being greater than twice a driving frequency.

2. The circuit according to claim 1, wherein the differential amplifier is a single-ended differential amplifier, the inverting input terminal of the differential amplifier is an inverting input terminal of the single-ended differential amplifier, the non-inverting input terminal of the differential amplifier is a non-inverting input terminal of the single-ended differential amplifier, and the output terminal of the differential amplifier is an output terminal of the single-ended differential amplifier, the first drive module is electrically connected to the inverting input terminal of the single-ended differential amplifier, the non-inverting input terminal of the single-ended differential amplifier is connected to the common mode voltage, and an output terminal of the single-ended differential amplifier is electrically connected to the processing module; and two terminals of the first suppression module are respectively connected to the inverting input terminal and the output terminal of the single-ended differential amplifier.

3. The circuit according to claim 1, wherein in a self-capacitance detection circuit, the driving frequency is a switching frequency at which a switch in the first drive module is turned on or turned off, or, in a mutual capacitance detection circuit, the driving frequency is a power supply frequency of the first drive module.

4. The circuit according to claim 1, wherein the differential amplifier is a double-ended differential amplifier, the double-ended differential amplifier has a non-inverting input terminal, an inverting input terminal, a first output terminal, and a second output terminal, the inverting input terminal of the differential amplifier is the inverting input terminal of the double-ended differential amplifier, the non-inverting input terminal of the differential amplifier is the non-inverting input terminal of the double-ended differential amplifier, and the output terminal of the differential amplifier comprises the first output terminal and the second output terminal of the double-ended differential amplifier, the first drive module is electrically connected to the inverting input terminal of the double-ended differential amplifier, the non-inverting input terminal of the double-ended differential amplifier is connected to the common mode voltage, and the first output terminal and the second output terminal of the double-ended differential amplifier are both electrically connected to the processing module; and two terminals of the first suppression module are respectively connected to the inverting input terminal and the first output terminal of the double-ended differential amplifier.

5. The circuit according to claim 4, wherein the conversion module further comprises a second suppression module, two terminals of the second suppression module are respectively connected to the non-inverting input terminal and the second output terminal of the double-ended differential amplifier, the control module is configured to control the second suppression module to suppress the interference signal with the frequency that is less than the first frequency or greater than the second frequency when the conversion module generates the output voltage, and the second frequency is greater than the first frequency.

6. The circuit according to claim 4, wherein the second suppression module comprises a second switch unit, a third capacitor, and a fourth capacitor; a first terminal and a second terminal of the second switch unit are respectively connected to the non-inverting input terminal and the second output terminal of the double-ended differential amplifier, two terminals of the fourth capacitor are directly and respectively connected to the first terminal of the second switch unit and the second terminal of the second switch unit, a first terminal of the third capacitor is electrically connected to a third terminal of the second switch unit, and a second terminal of the third capacitor is grounded; and the control module is configured to control the second switch unit to switch back and forth between the first terminal and the second terminal, so that the third terminal of the second switch unit is connected to the first terminal or the third terminal is connected to the second terminal, a switching frequency of the second switch unit is greater than twice a driving frequency, to suppress an electrical signal with a frequency less than the first frequency; and wherein in a self-capacitance detection circuit, the driving frequency is a switching frequency at which a switch in a second drive module is turned on or turned off, or, in a mutual capacitance detection circuit, the driving frequency is a power supply frequency of the second drive module.

7. The circuit according to claim 1, wherein the first drive module comprises an excitation power supply, and the excitation power supply is electrically connected to the first input terminal of the conversion module through the first capacitor to be measured.

8. The circuit according to claim 1, wherein the capacitance detection circuit further comprises a third switch unit, the third switch unit is connected between the first drive module and the first input terminal of the conversion module, and when the third switch unit is turned on, the conversion module performs charge conversion processing on the first capacitor to be measured to generate the output voltage.

9. The circuit according to claim 8, wherein the capacitance detection circuit further comprises a first offset module; and the control module is further configured to control the first offset module to charge a first offset capacitor, and to control the first offset capacitor to charge or discharge the first capacitor to be measured to perform charge offset.

10. The circuit according to claim 9, wherein the first offset module comprises a fifth switch unit, and the control module is further configured to control the fifth switch unit to be in a first closed state to form a charging branch so that the offset module charges the first offset capacitor; and the control module is further configured to control the fifth switch unit to be in a second closed state to form an offset branch so that the first offset capacitor charges or discharges the first capacitor to be measured to perform charge offset;
when the fifth switch unit is in the first closed state, two terminals of the first offset capacitor are respectively connected to a fourth voltage and a fifth voltage, and the fifth voltage is greater than the fourth voltage; and
when the fifth switch unit is in the second closed state, a first terminal of the first offset capacitor is electrically connected to a first terminal of the first capacitor to be measured through the fifth switch unit, a second terminal of the first offset capacitor is connected to a sixth voltage or a seventh voltage through the fifth switch unit, the sixth voltage is less than a second voltage connected to a second terminal of the capacitor to be detected, and the seventh voltage is greater than the second voltage connected to the second terminal of the capacitor to be detected.

11. The circuit according to claim 1, wherein the capacitance detection circuit further comprises a second drive module, the second drive module is electrically connected to the second input terminal of the conversion module, and the control module is further configured to control the second drive module to charge a second capacitor to be detected; and the conversion module is configured to perform charge conversion processing on the second capacitor to be detected to generate an output voltage.

12. The circuit according to claim 11, wherein the capacitance detection circuit further comprises a sixth switch unit, the sixth switch unit is connected between the second drive module and the second input terminal of the conversion module, and when the sixth switch unit is turned on, the conversion module performs charge conversion processing on the second capacitor to be detected to generate the output voltage.

13. The circuit according to claim 12, wherein the second drive module comprises a seventh switch unit, and the control module is further configured to control the seventh switch unit to be in a first closed state so that the second drive module charges the second capacitor to be detected; and when the seventh switch unit is in the first closed state, a first terminal of the second capacitor to be detected is connected to an eighth voltage through the seventh switch unit, a second terminal of the second capacitor to be detected is connected to a ninth voltage, and the eighth voltage is greater than the ninth voltage; and
the control module is further configured to control the seventh switch unit to be in a second closed state to discharge the second capacitor to be detected; and when the seventh switch unit is in the second closed state, the first terminal of the second capacitor to be detected is connected to a tenth voltage through the seventh switch unit, the second terminal of the second capacitor to be detected is connected to the ninth voltage, and the ninth voltage is greater than the tenth voltage.

14. The circuit according to claim 13, wherein the capacitance detection circuit further comprises a second offset module; and the control module is further configured to control the second offset module to charge a second offset capacitor, and to control the second offset capacitor to charge or discharge the second capacitor to be detected to perform charge offset.

15. The circuit according to claim 14, wherein the second offset module comprises an eighth switch unit, and the control module is further configured to control the eighth switch unit to be in the first closed state to form a charging branch so that the offset module charges the second offset capacitor; and the control module is further configured to control the eighth switch unit to be in the second closed state to form an offset branch so that the second offset capacitor charges or discharges the second capacitor to be detected to perform charge offset;
when the eighth switch unit is in the first closed state, two terminals of the second offset capacitor are respectively connected to an eleventh voltage and a twelfth voltage, and the twelfth voltage is greater than the eleventh voltage; and
wherein when the eighth switch unit is in the second closed state, a first terminal of the second offset capacitor is electrically connected to the first terminal of the second capacitor to be detected through the eighth switch unit, a second terminal of the second offset capacitor is connected to a thirteenth voltage or a fourteenth voltage through the eighth switch unit, the thirteenth voltage is less than the ninth voltage connected to the second terminal of the second capacitor to be detected, and the fourteenth voltage is greater than the ninth voltage connected to the second terminal of the second capacitor to be detected.

16. The circuit according to claim 1, wherein the first drive module comprises a fourth switch unit, and the control module is further configured to control the fourth switch unit to be in a first closed state so that the first drive module charges the capacitor to be measured; and when the fourth switch unit is in the first closed state, a first terminal of the first capacitor to be measured is connected to a first voltage through the fourth switch unit, a second terminal of the first capacitor to be measured is connected to a second voltage, and the first voltage is greater than the second voltage; and
the control module is further configured to control the fourth switch unit to be in a second closed state to discharge the first capacitor to be measured; and when the fourth switch unit is in the second closed state, the first terminal of the first capacitor to be measured is connected to a third voltage through the fourth switch unit, the second terminal of the first capacitor to be measured is connected to the second voltage, and the second voltage is greater than the third voltage.

17. A detection chip, comprising a capacitance detection circuit, the capacitance detection circuit comprised: a first drive module, a conversion module, a processing module, and a control module; the first drive module being configured to supply a first voltage to a first capacitor to be measured to charge the first capacitor to be measured; the conversion module being configured to perform charge conversion processing on the first capacitor to be measured to generate an output voltage, the conversion module comprising a first suppression module, the control module being configured to control the first suppression module to suppress an interference signal with a frequency that is less than a first frequency or greater than a second frequency when the conversion module generates the output voltage, and the second frequency being greater than the first frequency; and the processing module being configured to determine a capacitance change before and after the first capacitor to be measured is affected by an applied electric field based on the output voltage;

wherein the conversion module has a first input terminal and a second input terminal, the first input terminal of the conversion module is electrically connected to the first drive module, and the second input terminal of the conversion module is connected to a common mode voltage;

wherein the conversion module comprises a differential amplifier, the first input terminal of the conversion module is an inverting input terminal of the differential amplifier, the second input terminal of the conversion module is a non-inverting input terminal of the differential amplifier, the first drive module is electrically connected to the inverting input terminal of the differential amplifier, the non-inverting input terminal of the differential amplifier is connected to the common mode voltage, and an output terminal of the differential amplifier is electrically connected to the processing module, and two terminals of the first suppression module are respectively connected to the inverting input terminal and the output terminal of the differential amplifier;

wherein the first suppression module comprises a first switch unit, a first capacitor, and a second capacitor, wherein the first switch unit comprises a first terminal, a second terminal and a third terminal, the first terminal and the second terminal of the first switch unit being directly connected to the inverting input terminal and the output terminal of the differential amplifier respectively, and the third terminal of the first switch unit being connected to a first terminal of the first capacitor; a second terminal of the first capacitor is grounded; and two terminals of the second capacitor are directly connected to the inverting input terminal and the output terminal of the differential amplifier respectively; and the control module is configured to control the first switch unit to switch between a first closed state in which the third terminal contacts the first terminal and a second closed state in which the third terminal contacts the second terminal, such that the first capacitor is alternately connected to the first terminal of the first switch unit and the second terminal of the first switch unit to suppress an electrical signal which has a frequency less than the first frequency, a switching frequency of the first switch unit being greater than twice a driving frequency.

18. An electronic device, comprising: a detection chip, the detection chip comprised a capacitance detection circuit, the capacitance detection circuit comprised: a first drive module, a conversion module, a processing module, and a control module; the first drive module being configured to supply a first voltage to a first capacitor to be measured to charge the first capacitor to be measured; the conversion module being configured to perform charge conversion processing on the first capacitor to be measured to generate an output voltage, the conversion module comprising a first suppression module, the control module being configured to control the first suppression module to suppress an interference signal with a frequency that is less than a first frequency or greater than a second frequency when the conversion module generates the output voltage, and the second frequency being greater than the first frequency; and the processing module being configured to determine a capacitance change before and after the first capacitor to be measured is affected by an applied electric field based on the output voltage;

wherein the conversion module has a first input terminal and a second input terminal, the first input terminal of the conversion module is electrically connected to the first drive module, and the second input terminal of the conversion module is connected to a common mode voltage;

wherein the conversion module comprises a differential amplifier, the first input terminal of the conversion module is an inverting input terminal of the differential amplifier, the second input terminal of the conversion module is a non-inverting input terminal of the differential amplifier, the first drive module is electrically connected to the inverting input terminal of the differential amplifier, the non-inverting input terminal of the differential amplifier is connected to the common mode voltage, and an output terminal of the differential amplifier is electrically connected to the processing module, and two terminals of the first suppression module are respectively connected to the inverting input terminal and the output terminal of the differential amplifier;

wherein the first suppression module comprises a first switch unit, a first capacitor, and a second capacitor, wherein the first switch unit comprises a first terminal, a second terminal and a third terminal, the first terminal and the second terminal of the first switch unit being directly connected to the inverting input terminal and the output terminal of the differential amplifier respectively, and the third terminal of the first switch unit being connected to a first terminal of the first capacitor; a second terminal of the first capacitor is grounded; and two terminals of the second capacitor are directly connected to the inverting input terminal and the output terminal of the differential amplifier respectively; and the control module is configured to control the first switch unit to switch between a first closed state in which the third terminal contacts the first terminal and a second closed state in which the third terminal contacts the second terminal, such that the first capacitor is alternately connected to the first terminal of the first switch unit and the second terminal of the first switch unit to suppress an electrical signal which has a frequency less than the first frequency, a switching frequency of the first switch unit being greater than twice a driving frequency.

* * * * *